United States Patent [19]

Tomita et al.

[11] Patent Number: 4,637,134

[45] Date of Patent: Jan. 20, 1987

[54] APPARATUS FOR AUTOMATICALLY INSERTING ELECTRONIC PART

[75] Inventors: Tomoya Tomita, Narita; Sotozi Hiramoto; Takesi Okubo, both of Chiba; Kuniyuki Matsuo, Narashino; Hiromoto Ashihara, Funabashi; Mitsuo Nakamura; Tsutomu Takahashi, both of Sakura; Motoaki Fujino, Narashino; Kenji Hosaka, Chiba, all of Japan

[73] Assignee: Hitachi, Ltd., Tokyo, Japan

[21] Appl. No.: 702,265

[22] Filed: Feb. 15, 1985

[30] Foreign Application Priority Data

Mar. 9, 1984 [JP] Japan .................................. 59-44015

[51] Int. Cl.⁴ ............................................ H05K 3/30
[52] U.S. Cl. ........................................ 29/741; 29/759
[58] Field of Search ................. 29/741, 740, 739, 759, 29/834–839

[56] References Cited

U.S. PATENT DOCUMENTS

| | | | |
|---|---|---|---|
| 3,893,232 | 7/1975 | Fletcher et al. | 29/741 X |
| 4,202,092 | 5/1980 | Shibasaki et al. | 29/741 |
| 4,293,998 | 10/1981 | Kawa et al. | 29/741 X |
| 4,387,506 | 6/1983 | Wright et al. | 29/741 X |
| 4,459,743 | 7/1984 | Watanabe et al. | 29/740 |

Primary Examiner—Carl E. Hall
Attorney, Agent, or Firm—Beall Law Offices

[57] ABSTRACT

An apparatus for inserting a plurality of kinds of electronic parts into a predetermined position of a printed board. An electronic part which is successively supplied from an electronic part supplying means is fed to a predetermined supply positioning end by a feeding means. An insertion unit carries the electronic part from this position to a predetermined specific position, thereby inserting the electronic part into the printed board. The printed board is held and positioned by an X-Y table. At a position corresponding to said specific position, the apparatus has a clinching means for clinching the leads of the electronic part which is inserted into the printed board and a control means which controls a predetermined operation of each means.

9 Claims, 38 Drawing Figures

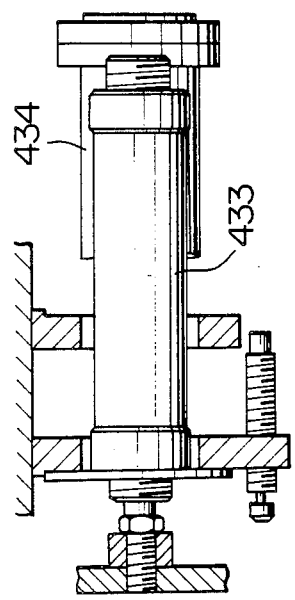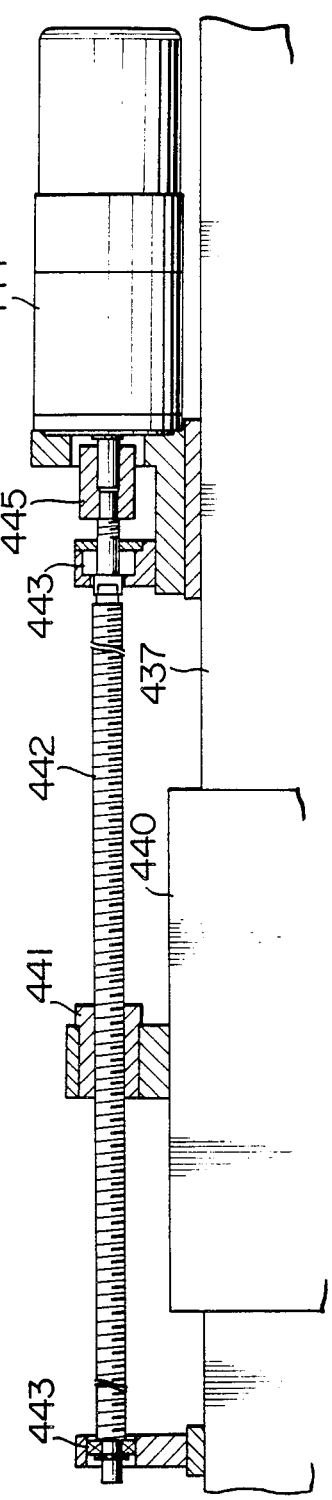

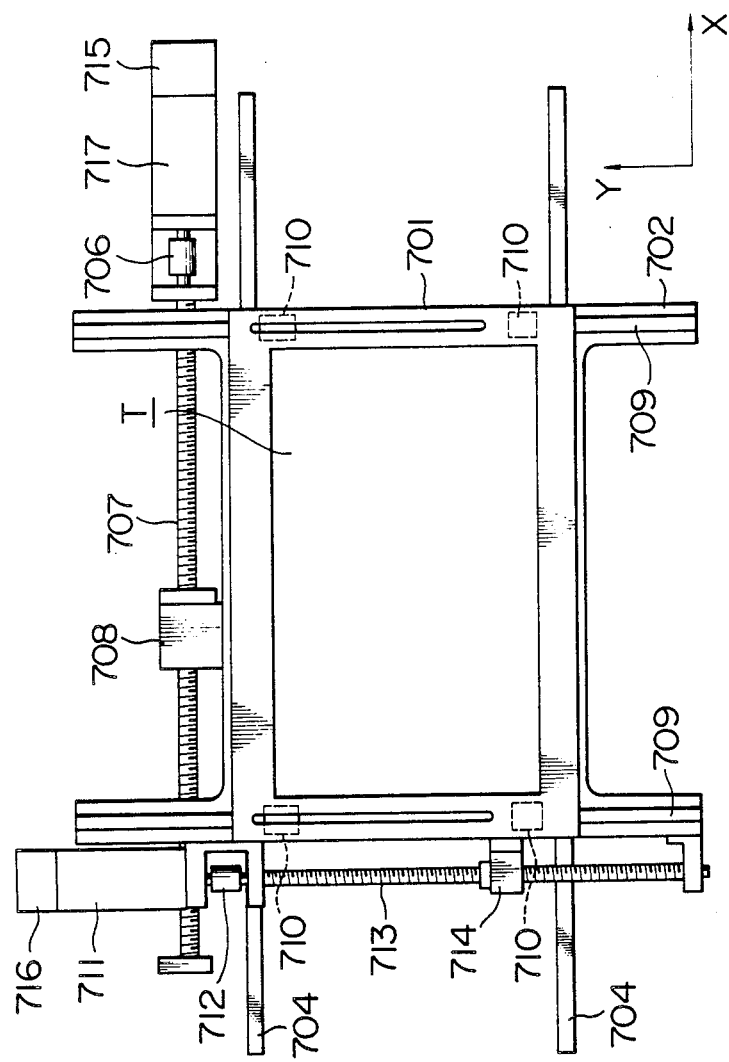

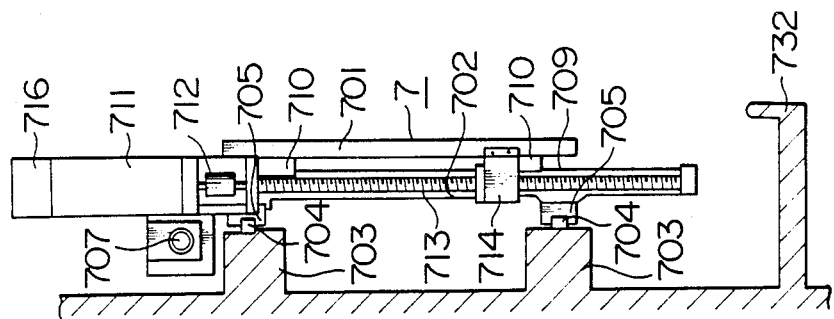
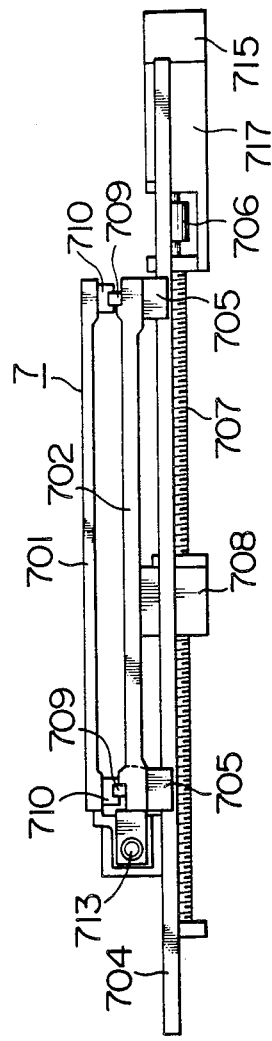
FIG. 30
FIG. 29

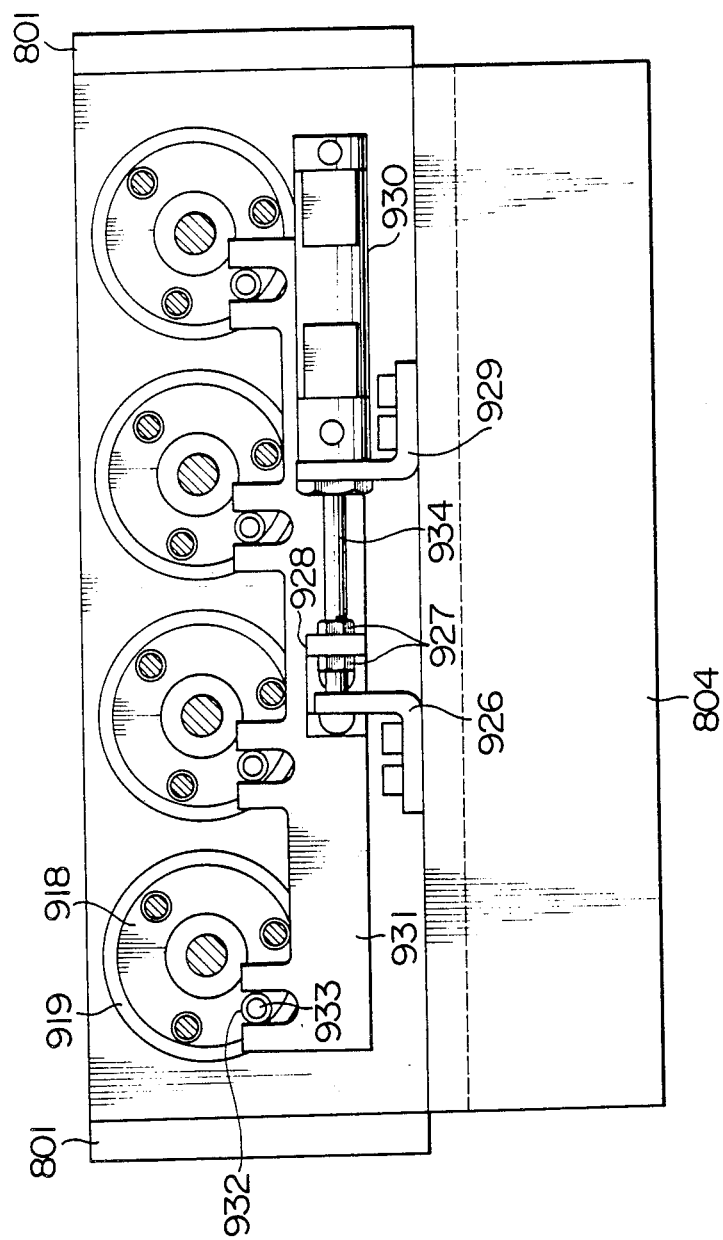

APPARATUS FOR AUTOMATICALLY INSERTING ELECTRONIC PART

BACKGROUND OF THE INVENTION

This invention relates to an apparatus for automatically inserting an electronic part such as an integrated circuit, semiconductor device, connector or coil.

In recent years, rapid progress has been made in automated techniques for the insertion of electronic parts, especially with respect to taping parts and standard integrated circuits (hereinunder referred to as IC). However, little progress has been made up to the present time in automation for the insertion techniques for what is called special form electronic parts such as integrated circuits which are not standard integrated circuits (including a hybrid integrated circuit), semiconductor device, connectors, coils, and variable resistances, because, since they have a wide variety of configurations and the number of insertions per printed board is small, profit in the related equipment investment is small.

SUMMARY OF THE INVENTION

Accordingly it is an object of the invention to obtain an apparatus capable of automatically inserting into a printed board plural kinds of electronic parts having different configurations with efficiency and with a higher ratio of success in insertion than has previously been possible.

It is another object of the invention to obtain an apparatus for automatically inserting electronic parts into a printed board with a shorter insertion time than in the prior art.

It is a further object of the invention to obtain an apparatus for automatically inserting electronic parts capable of treating a variety of parts of different shapes with hands arranged on a single insertion unit.

It is a still further object to obtain an apparatus for automatically inserting electronic parts capable of grasping a plurality of parts simultaneously by a single operation of hands arranged on a single insertion unit and thereby shortening the tact.

A still further object is to obtain an apparatus for automatically inserting electronic parts capable of conducting lead correction and lead cutting and of improving the ratio of success in insertion.

To achieve the objects described above, an apparatus according to the invention is provided with an electronic part supplying means, an electron part feeding means, an insertion unit, an X-Y table, a clinching means and a control means. The electron part supplying means is fixed at a predetermined position for storage and successive supply of a multiplicity of electronic parts. The electronic part feeding means feeds the electronic part which is supplied successively by the electronic part supplying means to a predetermined supply positioning end. The insertion unit takes out the electronic part from the supply positioning end by the action of a chuck and transfers it to a predetermined specific position. This insertion unit has a hand which inserts, at the specific position, the lead of the electron part into an electronic part receiving hole of a printed board located at a suitable position in relation to the specific position. The X-Y table holds the printed board into which the electronic part is inserted, and locates this printed board at a predetermined position on the X-Y plane of the printed board in accordance with an insertion position instruction which is different for each electronic part. The clinching means, which is situated on the opposite side of the printed board to the insertion unit means, approaches the printed board from this position so as to support it and clinches the end of the lead of the electronic part inserted into the printed board. The control means controls a predetermined operation of each of the above-described means.

In this way, a single apparatus can insert plural kinds of electronic parts having different configurations into a printed board with efficiency and a high ratio of success in insertion. Since the insertion unit, the movable portions of which have a large weight, has only to move reciprocatingly between a predetermined supply positioning end and a predetermined specific position, which is the minimum necessary movement, the insertion time can be shortened. In particular it may be noted that the specific position is a fixed position in correspondence with the position where the clinching means is disposed and all kinds of electronic parts are inserted here. Since the insertion position of any electronic part is fixed in this way, control of movement of the insertion unit is easier, which contributes to shortening of the insertion tact time. It is the X-Y table that locates the desired position where a particular electronic part of the printed board is to be inserted, this position being located in correspondence with the special position described above. This positioning is preferably conducted during the period between the point where the insertion unit goes to a predetermined supply positioning end to take out the electronic part and the point where the insertion unit carries the electronic part to the above-described specific position. This also greatly contributes to shortening the insertion time.

In a preferred embodiment of the present invention, the insertion unit is retained by a transferring means which is capable of reciprocating said insertion unit in one predetermined direction. This constitution is able to carry to a position away from the specific position an electronic part grasped by the chuck which proves to be inappropriate for insertion, for example, an electronic part in which the lead is extremely bent, and then releases it. Further, by arranging a multiplicity of supply positioning ends in this predetermined direction, and providing electronic part supplying and feeding means at each positioning end, a greater number of electronic parts can be inserted at a time.

The insertion unit has a plurality of hands, whereby a single operation can carry many electronic parts to the insertion position, which also contributes to shortening the insertion time. In this case, control is facilitated by operating each hand separately from each other only during the period when each electronic part is inserted at the specific position by the hand which grasps it, and operating them simultaneously during other periods.

In addition, in another preferred embodiment of this invention, the insertion unit is supported by a shaft on the opposite side to that where the hands are attached, such as to be rotatable around the supporting shaft. This rotatable action transfers the hands from the supply positioning end to the specific position. This makes the movement of the insertion unit smooth and more rapid, which contributes all the more to a shortened insertion time.

The above and other objects, features and advantages of the present invention will become clear from the following description of the preferred embodiments

BRIEF DESCRIPTION OF THE DRAWINGS

FIG. 20 is a cutaway side elevational view explaining the hand transferring means;

FIG. 21 is a plan view which explains the transfer of the hand transferring means in the X-axial direction;

FIGS. 28, 29 and 30 are respectively a plan view, an elevational view and a side elevational view of an X-Y table;

FIG. 38 is a plan view of a rotating mechanism of the clinching means.

DESCRIPTION OF THE PREFERRED EMBODIMENT

Figure 1:
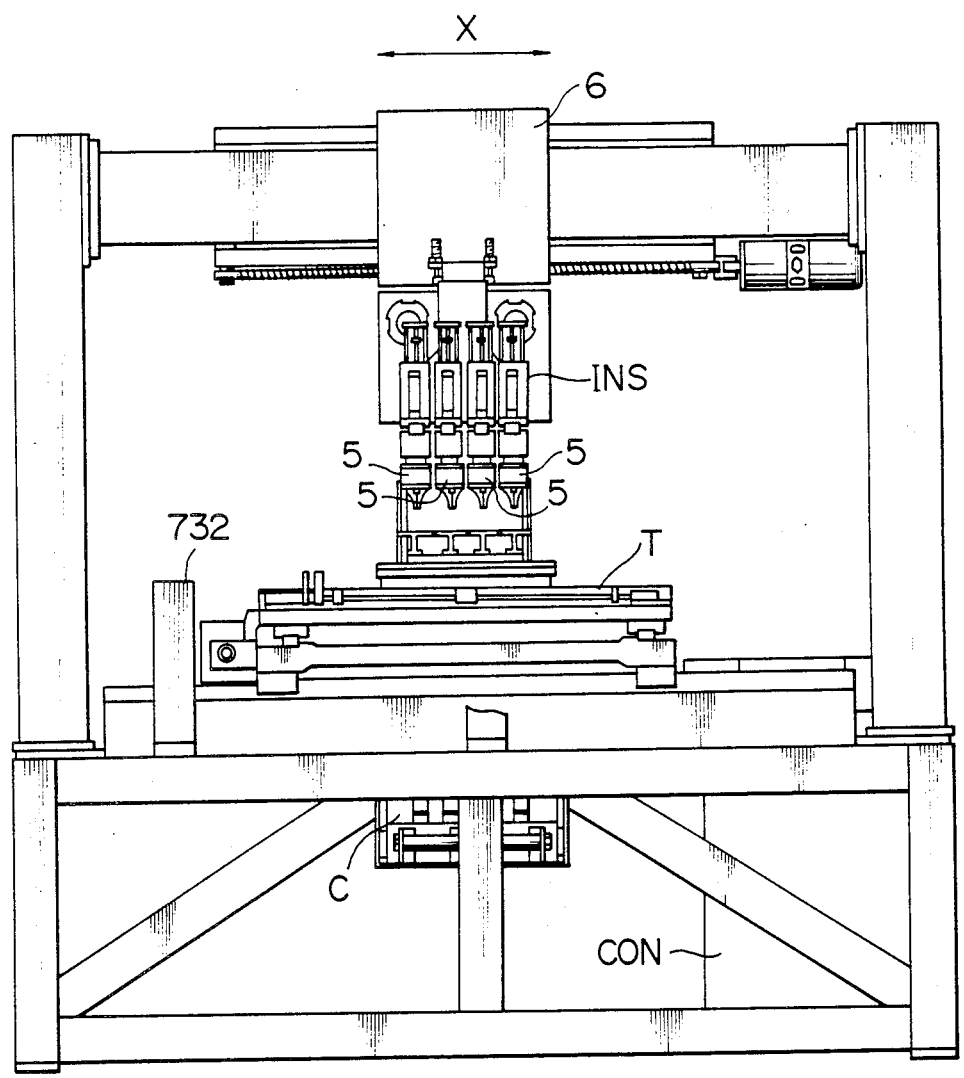
FIG. 1 is an elevational view of an embodiment of the invention.
Figure 2:
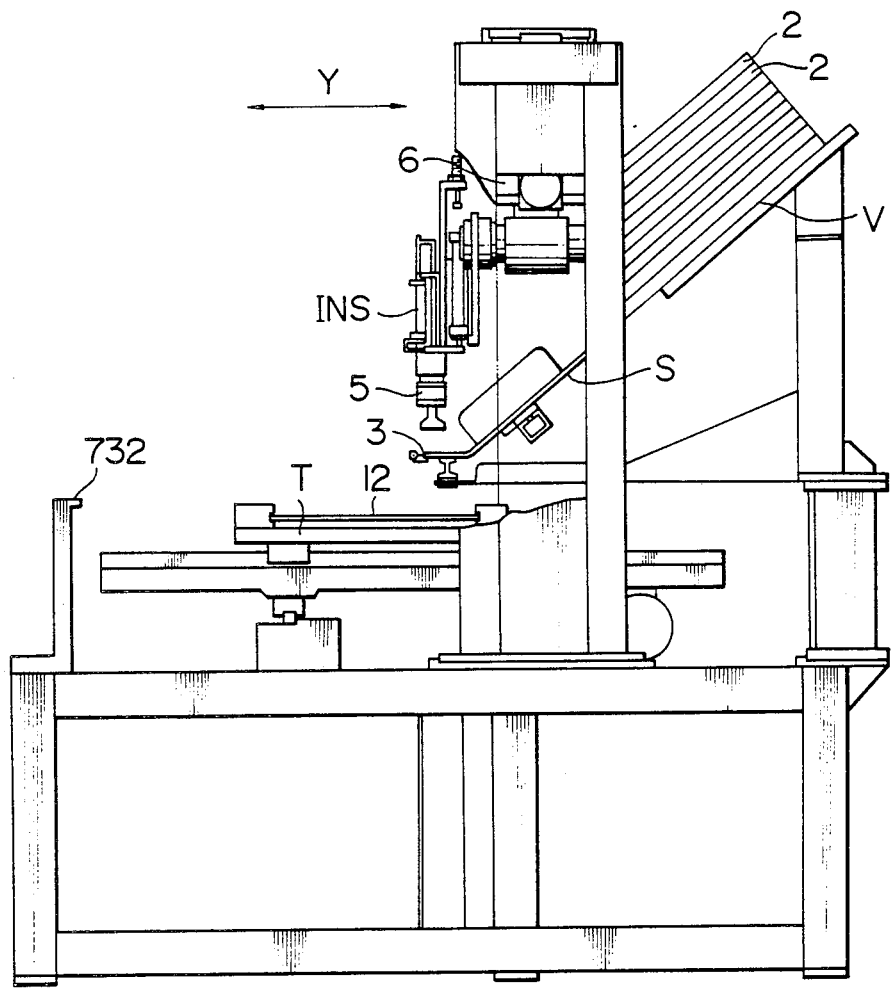
FIG. 2 is a side elevational view of the embodiment shown in FIG. 1.
Figure 3:
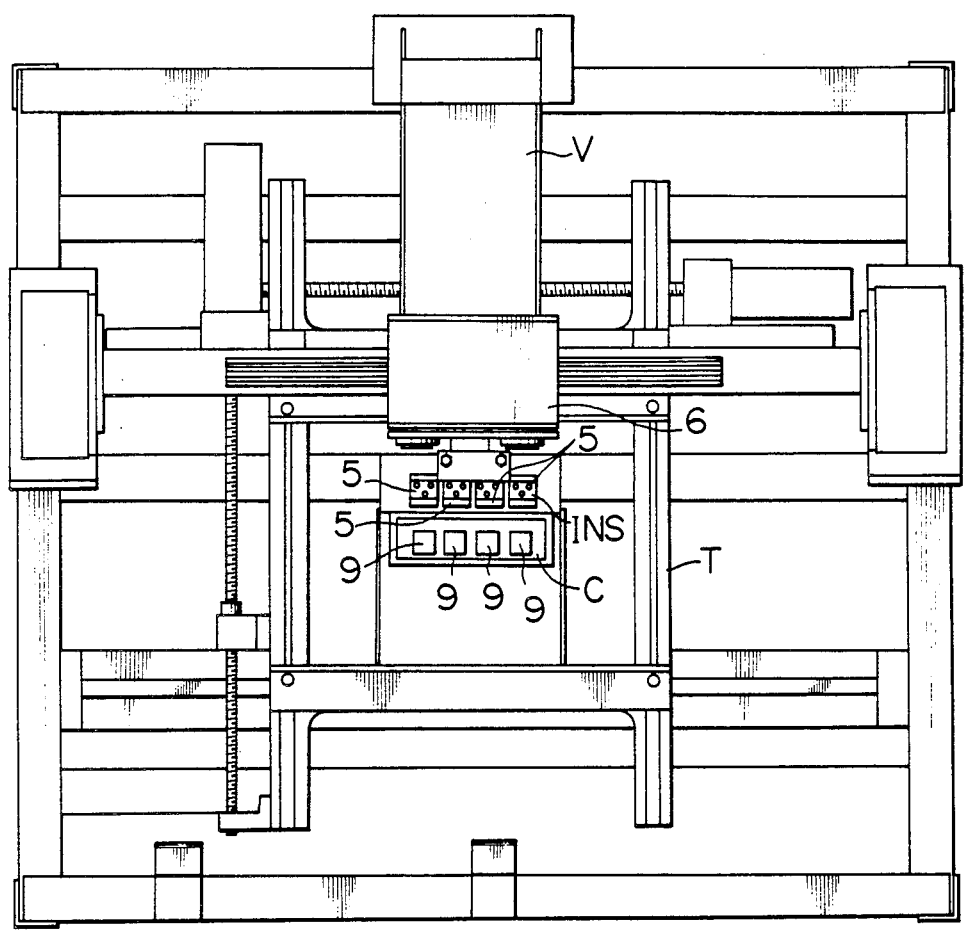
FIG. 3 is a plan view of the embodiment shown in FIG. 1.

FIGS. 1, 2 and 3 are respectively an elevational view, side elevational view and a plan view of the exterior of an embodiment of the present invention. In the Figures, referential symbol V denotes a part supplying means, S a chute means, INS an insertion unit, T an X-Y table, C a clinching means and F a body frame. The part supplying means V is disposed in an inclined manner with the insertion unit INS facing downwards, and is provided with stacked magazines 2 each of which accomodates a multiplicity of electronic parts. The lowermost magazine 2 is discharged after it is confirmed that no part is left therein, and thereafter the next magazine 2 descends to automatically supply an electronic part. Electronic parts supplied from the magazine 2 consistently go to the location of a supply positioning end 3 of the chute means S by virtue of gravitational effect. There are some electronic parts in respect of which it is possible to add a mechanism for carrying out lead correction or lead cutting between the magazine 2 and the supply positioning end 3, thereby heightening the ratio of success in insertion. Some electronic parts have such high centers of gravity and are so easy to overturn that the effect of gravity-drop cannot be utilized. In such case, the parts may be arranged horizontally and be forcibly fed to the supply positioning end 3 by vibration or the like. In addition, in the case of supplying loose parts it is possible to supply them to the supply position positioning end 3 through an inclined part feeder, a straight feeder or the like. The insertion unit INS is composed of a set of four elevating and descending hands 5. An insertion unit transferring means 6 has a mechanism for transferring the insertion unit INS in the direction X shown in FIG. 1. This structure makes it possible to insert a multiplicity of kinds of parts of any number (N) provided that the number of hands is a factor of N, and to conduct the discharge of a defective part, lead correction or automatic replacement of a chuck by making use of an idle station. The X-Y table T, which drives a screw shaft (ball screw) by a servo-motor, carries out positioning in two directions orthogonal to each other in the same plane. The clinching means C is composed of a set of four clinching units 9 which are correspondent with the hands 5 and which clinch or crush the leads of an electronic parts to prevent the electronic part from slipping off the printed board after insertion. The clinching units 9 include a mechanism for rotating an electronic part by 90 degrees, a lead detection mechanism for confirming that a part has been inserted and a mechanism for holding the printed board. The hand 5 is provided with a mechanism for grasping an electronic part and a mechanism for rotating the electronic part by 90 degrees. The control means CON stores a device for controlling the entire operation.

The operation of an apparatus of the above-described structure will be explained in the following. Under the instruction of the control means CON, the insertion unit transferring means 6 first transfers the insertion unit INS to a position above the selected supply positioning end 3. The four hands 5 of the insertion unit INS are next lowered to grasp the electronic part at the supply positioning end 3 and are then elevated, whereupon the insertion unit INT is transferred to a position above the clinching means C having clinching units 9 which correspond to each hand 5. Thereafter under the instruction of the control means CON the X-Y table T transfers a printed board 12 which is set on the upper table such that an electronic part receiving hole of the printed board 12 corresponds to the insertion position of the part which is held by one of the hands 5 of the insertion unit INS. If position correction by means of an optical quarter-wave plate is applied, it fits the insertion position by detecting and correcting the amount of deviation, when the part insertion hole of the printed board is not in the correct position. At a positioning finishing signal the clinching unit 9 of the clinching means C under the printed board 12 which is in correspondence with the insertion hand 5 is elevated and assumes a state of waiting for insertion while holding the printed board 12. The selected hand 5 is next lowered to insert the leads of the electronic part held by it into the electronic part receiving hole of the printed board 12, and an optical sensor built in the clincher of the clinching unit 9 detects and clinches the leads. If the leads are not detected by the optical sensor, the electronic part is judged as a mis-insertion and is discharged to a defective part discharging means. This action is called "retry" and the number of times retry is attempted can be set freely. In this embodiment, retry is carried out at most three times, and when retry has been unsuccessfully attempted three times, the apparatus indicates abnormality and stops before a fourth retry. In this way, the action of positioning in relation to the printed board 12, insertion and clinching is repeated for every part held by the hand 5, and the hand 5 then returns to the initial action of grasping a part at the supply positioning end 3 and this sequence of actions is repeated. The structure of each means for performing the above-described actions will be explained in detail in the following.

Figure 4:
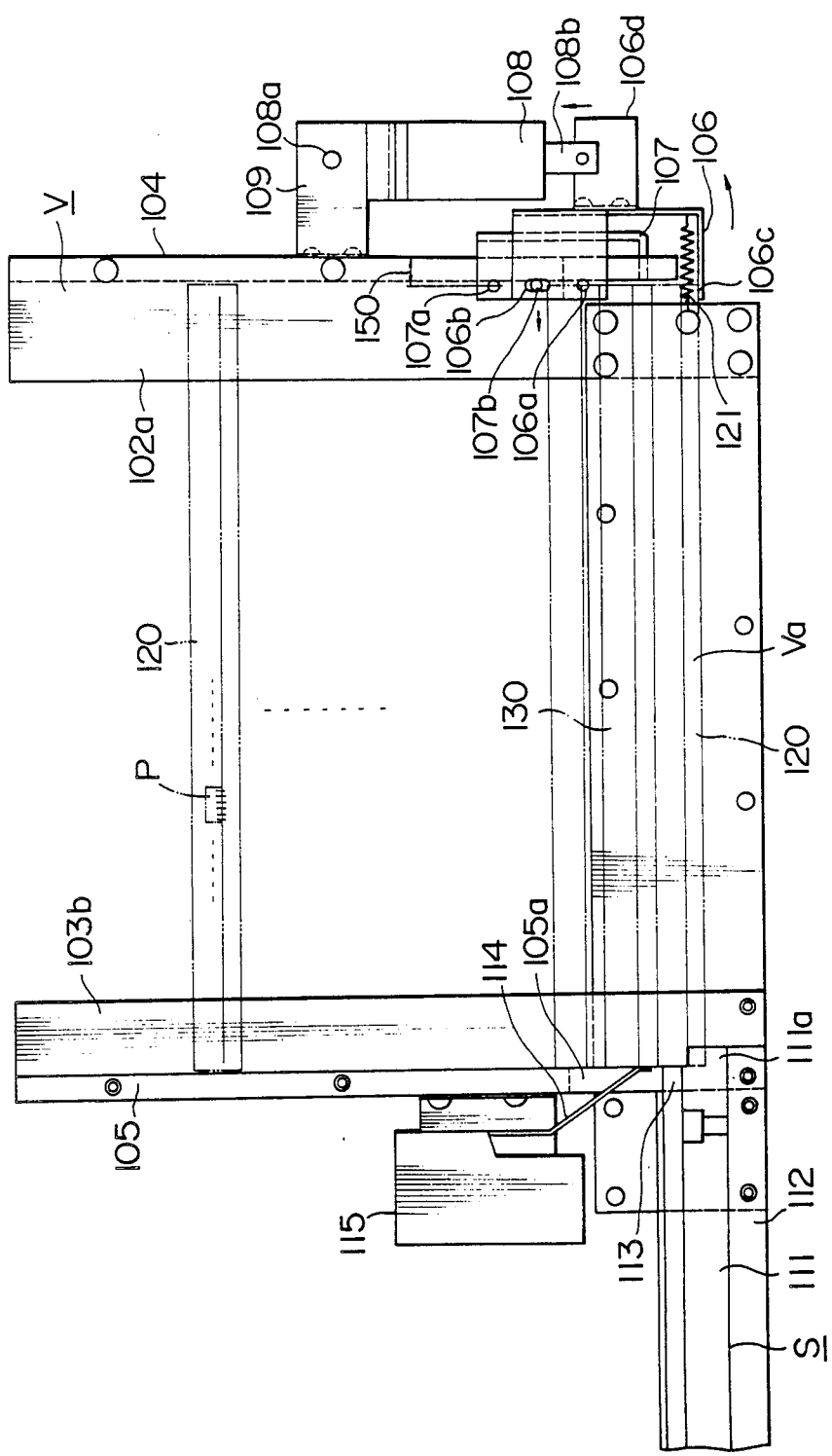
FIGS. 4, 5 and 6 are respectively a side elevational view, plan view and rear elevational view of a magazine supplying portion.
Figure 5:
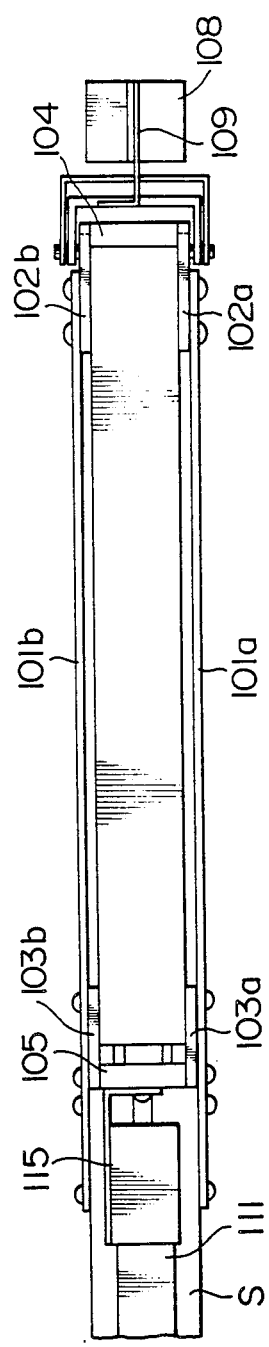
Figure 6:
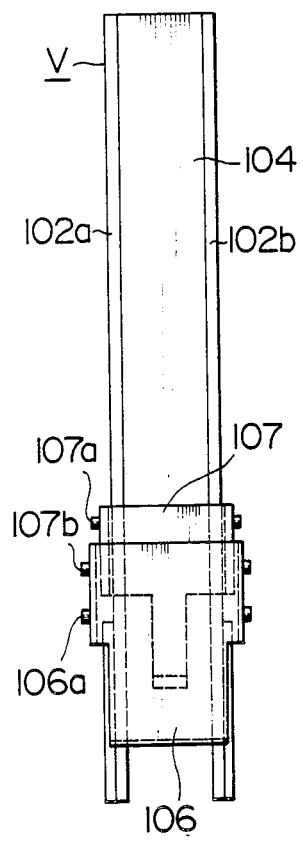
Figure 7:
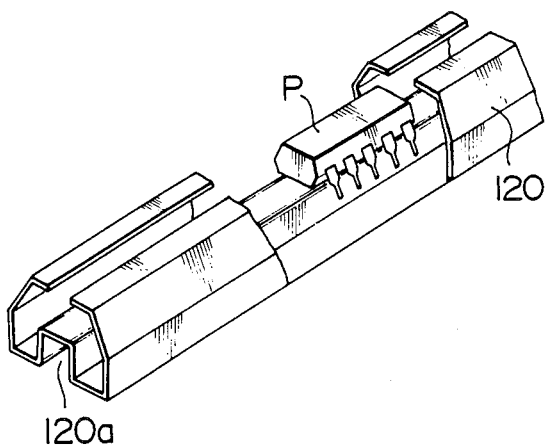
FIG. 7 is a perspective view of a magazine.

The electronic part supplying means V will be first explained. This supplying means V essentially consists of a magazine charging means Va, a part escape means Vb, and a lead correcting mechanism Vc. FIGS. 4, 5 and 6 are a side elevational view, a plan view and a rear view, respectively, of the magazine charging means Va. Actually, since this charging means Va utilizes gravity-drop, it is fixed at an incline of about 40 degrees. This charging means Va accommodates about 15 to 20 stacked magazines 120, which are supported by forward magazine guides 103a, 103b and 105 arranged ahead of the magazine 120 and rear magazine guides 102, 102b and 104 arranged at the back of the magazine 120. Small gaps are provided between these magazine guides and the magazines 120 themselves which allow a magazine 120 to drop smoothly. An escape mechanism for discharging the lowermost magazine 120 when it empties is provided in the magazine guides 102a, 102b and 104. A magazine retainer 106 supports the lower end of the magazine 120 from the lowermost layer and the other escape retainer 107 is situated at a position where it fits into the depression (120a) in the center of the rear end of the next magazine 130 (FIG. 7). The magazine retainer 106 has a drive solenoid 108 attached to an arm 109 portion with a pin 108a in such a manner that the upper end thereof is rotatable.

The magazine retainer 106 is rotatable around a shaft 106a, and has a slit 106b for driving the magazine retainer 107. The magazine retainer 107 is rotatable around a shaft 107a, and the rotation is urged in the direction opposite to the retainer 106 by a pin 107b inscribed in the slit 106b. The magazine retainer 106 is urged by a spring 121 in a direction which enables it to support the rear end of the lowermost magazine 120 in the normal state.

Figure 8:
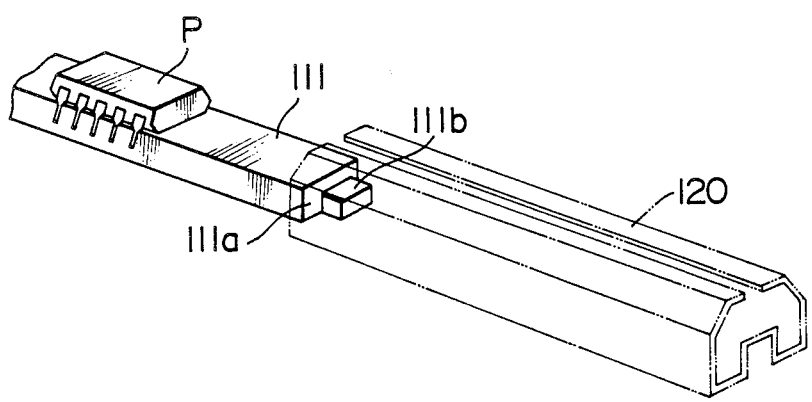
FIG. 8 is a perspective view of the end portion of a shoot rail.

In the vicinity of the magazine guides 103a, 103b and 105, is provided a switch 115 for detecting the last magazine remaining after the other magazines have been discharged. The actuator 114 of the switch 115 is disposed such as to project from the groove 105a formed on the guide 105 and to be actuated by the end surface of the second lowermost magazine 130. The end portion 111a facing the magazine 120 of a chute rail 111 of the chute means S projects slightly (about 5 mm) from the forward magazine guide 105, and has an appropriate difference in level 111b at its end such as to fit into the depression 120a of the fore end of the magazine 120 and enable smooth drop of an electronic part P when the magazine 120 is located at the right position, as is shown in FIG. 8.

The operation of the magazine charging means Va will now be explained in the following. Magazines 120 each of which is charged with 15 to 20 electronic parts P are laid one on top of the other between the forward and rear guides with their openings facing the forward magazine guides after the plugs employed for retaining electronic parts have been removed. The fore end 120a of the magazine 120 is supported by the end portion 111a of the chute rail 111 and the rear end of the magazine 120 is supported by the magazine retainer 106. In the middle a space is provided which allows an empty magazine to be discharged. The lowermost magazine has the magazine 130 and the other magazines above it, and when the lowermost magazine 120 is discharged, each of these remaining magazines moves down to the next level in succession. When the magazine 120 is first charged, electronic parts P drop from the magazine 120 onto the chute rail 111 through an opening means 113. These parts are controlled to drop successively in correspondence with the timing of an inserting machine by an escape device Vb provided for feeding the parts individually which will be described later. On the chute rail 111 is provided a part detecting mechanism which will also be described later. When no electronic part P is left in the magazine 120, this detecting mechanism detects the fact and applies an output signal to the solenoid 108, which is an actuator for discharge of empty magazines. Thereby, the solenoid 108 overcomes the urging force of the spring 121 and lifts a lever 106d upward by means of a plunger 108b. This action rotates the magazine retainer 106 in the direction indicated by the arrow, and the end of the retainer 106c is removed from the rear end of the magazine 120. Then, the lowermost magazine 120 drops obliquely and though the fore end 120a is supported by the end portion 111a of the chute rail 111, since the length overlapping with the end portion 111a of the rail is only about 5 mm, which is too short to support the entire length of the magazine 120, the magazine 120, after all, drops downward and the fore end of the next magazine 130 is then supported by the end portion 111a of the rail. When the magazine retainer 106 moves in the direction of the arrow, as described above and releases the rear end of the lowermost magazine 120, the other magazine retainer 107 is driven to support the rear end of the next magazine 130. To explain this in detail, with the drive of the magazine retainer 106, the slit 106b moves in the direction opposite to the driving direction of the magazine retainer 106 around the shaft 106a, as is indicated by the arrow, and drives the pin 107b which is secured to the magazine retainer 107 in the same direction, thereby driving the magazine retainer 107 around the shaft 107a in the direction indicated by the arrow. In this way when the solenoid 108 receives the signal and the plunger 108b is lifted upward, the lowermost magazine 120 drops downward, and the rear end of the next magazine 130 is supported by the magazine retainer 107. Next, when the output signal to the solenoid 108 is stopped, the plunger 108b is released and the magazine retainer 106 is drawn to its initial position by the spring 121, and at the same time, by the action reverse to the one described above, the magazine retainer 107 is removed from the rear end of the magazine 130, whereby the rear end of the magazine 130 drops and is supported by the magazine retainer 106. At this time all the magazines 120 above the magazine 130 move down simultaneously. In this way, empty magazines 120 are discharged downwardly in succession, and magazines containing electronic parts are located at the opening portion 113 for feeding to the inserting machine body by means of the chute rail 111. When the magazine 120 becomes the last one left, a warning signal giving a prior warning of the impending exhaustion of the supply of parts is output by releasing the actuator 114 of the switch 115.

The magazine retainer 106 is formed such as to have a U-like configuration in cross section and the position 150 of the supporting point of the shaft 106a is determined such as to be substantially the same as the position of the rear end of the magazine 120. This is useful for preventing the generation of moment force which would rotate the magazine retainer 106 rightwardly or leftwardly as a result of the force produced by the dropping of the magazine 120, and for preventing the magazine retainer 160 from being pushed in the direction indicated by the arrow, in resistance to the force of the spring 121, by virtue of the impact force produced when adding a magazine from above or dropping all the magazines, and thus prevents any undesirable dropping of a magazine. This can be prevented also by increasing the elasticity of the spring 121, but in that case, it is disadvantageously required that the solenoid 108 be made larger. By determining the position of the support point of the shaft 106a in the way described above, it is possible not only to use the smallest necessary solenoid but also to stack a multiplicity of comparatively heavy magazines such as those for special form electronic parts.

Figure 9:
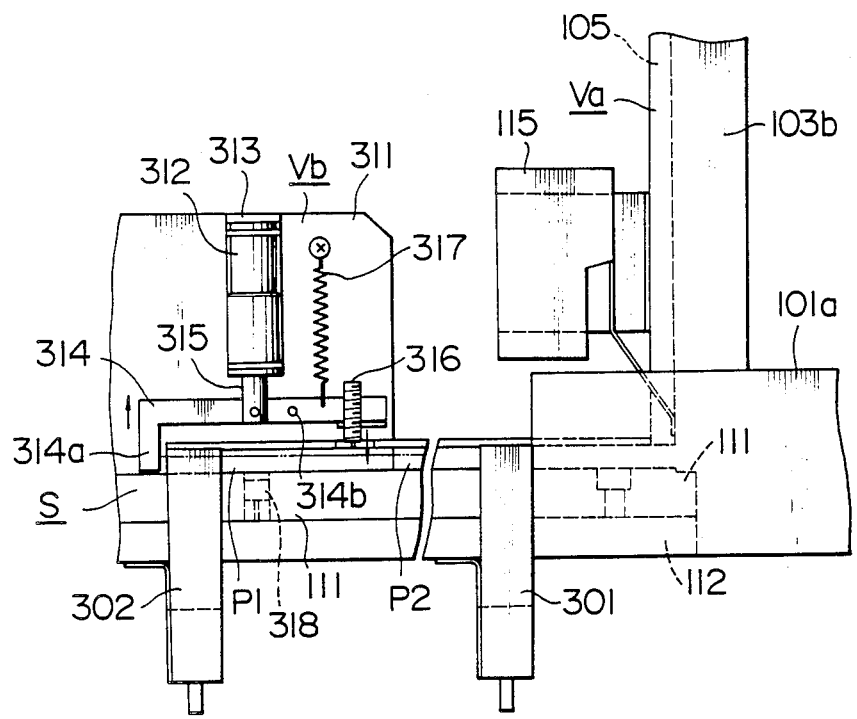
FIGS. 9 and 10 are side elevational views of an escape means.
Figure 10:
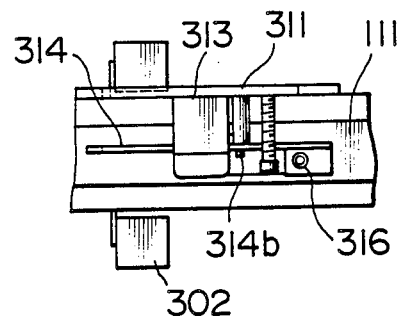

Electronic parts P in the magazine 120 pass through the chute rail 111 and drop to the supply positioning end 3 where the insertion hand 5 conducts the action of grasping. Between the chute rail 111 and the supply positioning end 3 is an escape mechanism for feeding parts individually as they drop from the magazine 120 in succession. FIG. 9 is a side elevational view of the escape mechanism Vb and FIG. 10 a plan view thereof. This escape mechanism is composed of a detent 314 for temporarily stopping the dropping electronic parts P, a solenoid 312 for vertically moving the detent 314, a support pin 314b for rotatably supporting the detent 314, a spring 317 which is urged in the normal state such as to press the end of the detent 314a about the support pin 314b and thereby to retain the parts, a controllable spring plunger 316 which is fixed on the detent 314 at a position above the part P2 next to the part P1 to be retained, and members 313, 311 for fixing the solenoid 312, spring 317, and support pin 314b. It is possible to attach, as occasion demands, a sensor 302 for detecting parts, and a sensor 318 for confirming the vertical position of the detent 314. The operation of the escape mechanism is as follows. The electronic parts P which have dropped from the magazine 120 through the chute rail 111 are retained by the end portion 314a of the detent 314 and are stopped in a line. When the sensor 302 confirms a presence of a part and outputs a signal to the solenoid 312, the plunger 315 is urged and draws the detent 314 upwards in resistance to the force of the spring 317, whereby the detent 314 moves around the support point 314b in the direction indicated by the arrow. Then the part P1 is released to drop down the chute rail 111. At this time the spring plunger 316 is pushed downwardly in the direction indicated by the arrow and presses the upper surface of the next part P2. In this way, only the part P1 is released. After the part P1 was dropped, the urging of the solenoid 312 is stopped, whereby the detent 314 is restored to its original state by the force of the spring 317, and the end portion of the detent 314a returns to the retaining state. At the same time the spring plunger 316 moves upward as it presses the part P2, whereby the part P2 is released and drops to the point where it is retained by the detent end 314a. Repetition of this process allows the parts which have dropped from the magazine 120 in succession to be fed to the handling portion one by one. The use of the spring plunger 316 solves the problem of parts lacking in uniformity of height, and enables a stable escape action.

Figure 11:
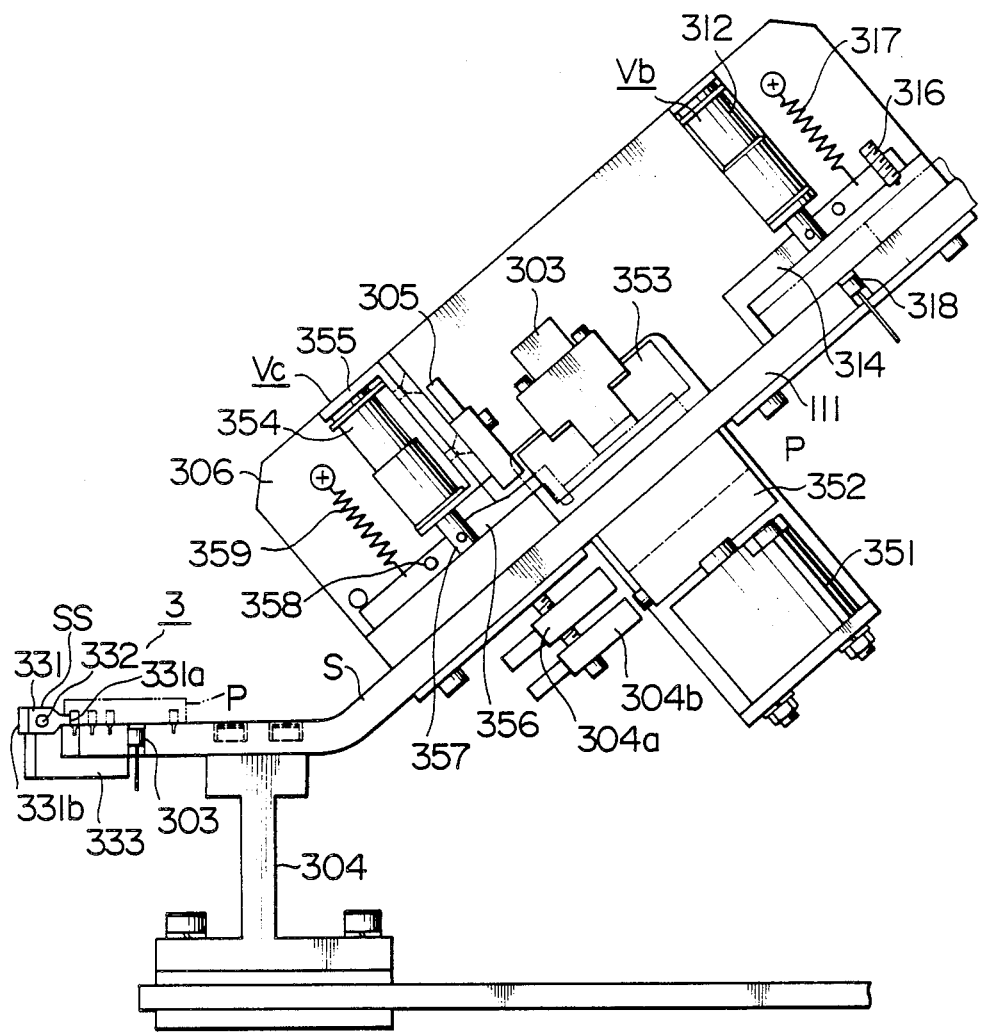
FIG. 11 is a side view of a stopper means and a lead correction means.
Figure 12:
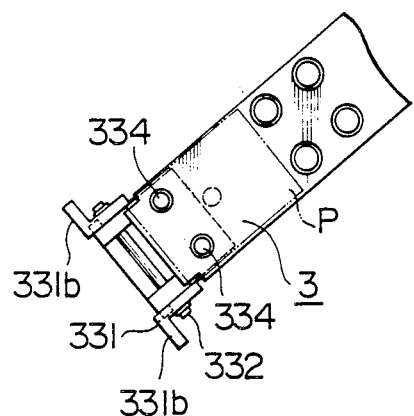
FIG. 12 is a plan view of the stopper means.
Figure 13:
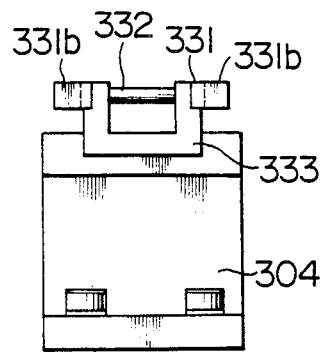
FIG. 13 is an elevational view of the stopper means.

The electronic parts P which are separated from each other by the escape mechanism Vb drop onto the inclined chute rail 111 of the chute means S and drop by gravity to the supply positioning end 3, where they are retained by stopping means SS precisely at the stop position. FIG. 11 is a side elevational view of the stopping means SS, FIG. 12 a plan view thereof and FIG. 13 an elevational view thereof. The stopping means SS is composed of a stopper click 331, a pin 332 which rotatably retains the stopper click 331, and a fixing member 333 for holding the pin 332. The fixing member 333 is secured to the chute rail 111 by bolts 334 in such a manner that microadjustment control is possible. The chute rail 111 is angled such that the inclined part of the rail changes midway into a horizontal rail, but in some cases, depending upon the structure of the hand, the entire length of the chute rail may be an inclined rail at a constant angle and be retained by the stopping means SS. The electron part P which has fallen to the stopping means SS is retained by the stopper click 331. When the sensor 303 detects an electronic part P, the hand 5 is lowered to grasp the electronic part P on the command of a driving instruction. The end of the hand sometimes interferes with the end portion 331a of the stopper click 331, but, since the clic 331 can freely move downward around the pin 332, when the hand 5 is lifted after the action of grasping the part P, the stopper click 331 can return to its original state by the force of gravity of the end portion 331b without the need for any driving source. A referential numeral 304 denotes a supporting member which functions to securing the side of the positioning end 3 of the chute means S to the frame of the body F.

Figure 14:
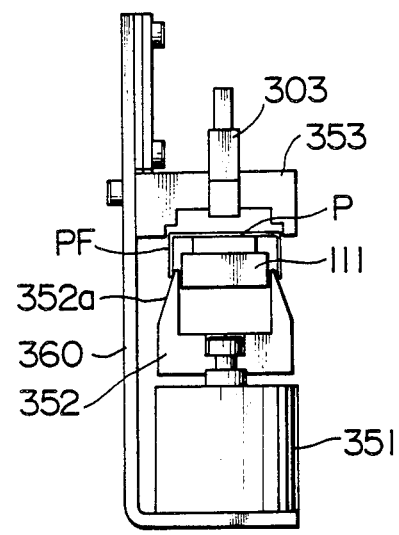
FIG. 14 is an elevational view of the lead correction means.

The object of lead correction of an electronic part is to correct inward deflection of the lead ends of a part which has leads arranged in pairs such as an IC part, and this invention is characterized in that lead correction is conducted successively at some position on the chute rail 111. FIG. 11 is a side elevational view of the lead correction means Vc and FIG. 14 an elevational view thereof. This means Vc is composed of an upper guide 353 for holding a part P from the topside at the time of correction and two correction claws 352 which hold the part P from the lower side, an air cylinder 351 for vertically moving the claws 352 and a side plate 360 for supporting the part P. The upper guide 353 and the correction claws 352 each have configurations which corresponds to the electronic part P, and the correction claws 352 have configuration which allows them to be lifted from both sides of the rail 111 in order to prevent interference with the chute rail 111. The width of the chute rail may be changed, as occasion demands, such as to prevent such interference. The end portion 352a of the correction claws 352 is designed to have a width narrower than the distance between a pair of leads of a part before correction and to have, on both sides, slanting surfaces tapering upwardly and converging at an angle suitable for spreading each pair of leads with the ascent of the claws 352. In order to retain the part to be corrected at a position suitable for correction, this means is also provided with a retaining member 356 which is supported such as to be rotatable around a support point 358, a solenoid 354 and a plunger 357 for vertically moving the retaining member 356, a spring 359 which urges the retaining member 356 in the normal state, and side plates 360 for fixing the support point 358, the solenoid 354, the spring 359 and the like. A sensor 303 for detecting a part P, sensors 304a and 304b for detecting the upper and lower edges of the air cylinder 351, and a sensor 305 for confirming the vertical motion of the retaining member 305 may be attached in accordance with demands. The operation of the correcting mechanism will now be explained. The correcting means 350 is usually provided between the escape means 310 and the supply positioning end 3. When a part P is fed from the escape means 310 individually, it drops onto the chute rail 111 and is retained by the retaining member 356. After it is confirmed that the part P has been retained, the correction claws 352 are elevated by the air cylinder 351. The upper surface of the part P is fixed by the guide 353, and the pairs of leads PF of the part P are spread outwardly by virtue of the inclined surfaces 352a. After this correction, the air cylinder 351 and the correction claws 332 are lowered and the retaining member 356 is lifted by virtue of the urging of the solenoid 354, whereby the part P released from the retaining drops onto the chute rail 111 by gravity and arrives at the part stopper means 330.

Figure 15:
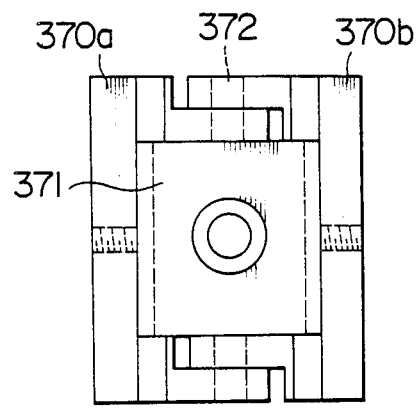
FIGS. 15 and 16 are respectively a plan view and an elevational view of another example of a correction claw.
Figure 16:
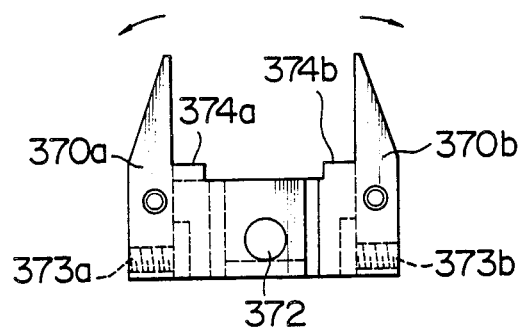

In the case where correction by the wedging action of the inclined surfaces by elevating the correction claws 352 as described above is insufficient, it is possible to provide correction claws having a structure the plan view of which are shown in FIG. 15 and the side elevational view of which are shown in FIG. 16. These correction claws 370a and 370b are rotatably supported by a support pin 372 which is secured to a supporting member 371. The correction claws 370a and 370b are situated on both sides of the supporting member 371 and have adjustment screws 373a and 373b, respectively, which makes the working range controllable. The supporting member 371 is secured to the rod of the air cylinder 351, as in the case shown in FIG. 14, and moves vertically. The correction claws 370a and 370b are provided with protrusions 374a and 374b, respectively, on the side surfaces facing the chute rail 111. The height of the protrusions is determined by an appropriate divergence of the correction claws 370a and 370b. The remaining structural features are substantially the same as the correction claws shown in FIG. 14. The operation of the correction claws 370a and 370b is as follows. The correction claws 370a and 370b are elevated at the same time when the supporting member 371 above the cylinder 351 is lifted, and immediately before the upper limit the protrusions 374a and 374b come into contact with the lower surface of the chute rail 111. The air cylinder 351 continues to be elevated and pushes up the support pin 372, whereby the moment force which opens the correction claws 370a and 370b outwardly around the support pin 372 is applied to the claws. In this way the end portions of the claws are opened in the directions indicated by the arrows in FIG. 17, thereby spreading the leads RF outwardly. This divergence can be controlled so as to be suitable for the leads PF of the part by the adjustment screws 373a, 373b, the protrusions 374a, 374b, the cylinder stroke employed and the like.

In this way, this control mechanism can correct an inward deflection of the lead PF by the ascending action, or, if necessary, by the ascending and opening action, of the inlined surfaces of the correction claws 352. The leads PF which has been spread outwardly are introduced to the fingers of the hand 5 by means of a guide groove formed for the purpose of guiding leads and are positioned accurately at the time of grasping. This correction mechanism is characterized in that the correction means 350 can be disposed between the escape mechanism 310 and the stopper means 330 by extending the chute rail 111, that continuous correction is enabled by taking advantage of the fact that parts are individually fed from the escape mechanism 310, and that the entire mechanism can be made compact by reducing the widthwise size thereof. In this embodiment, the fixed guide 353 is on the upper side of the rail and the claws 352 are on the lower side, but it is possible to use a structure the other way with the driving source on the upper side.

The insertion unit INS will next be explained. The insertion unit 4 graps an electronic part P located at the supply positioning end 3 and inserts it into a predetermined position of the printed board 12 which has been located by the X-Y table T. This unit 4 is mainly composed of hands for grasping electronic parts P, a hand elevating means for elevating and lowering the hands and a hand transferring means for transferring the hand in the direction X and Y shown in FIGS. 1 and 2.

Figure 17:
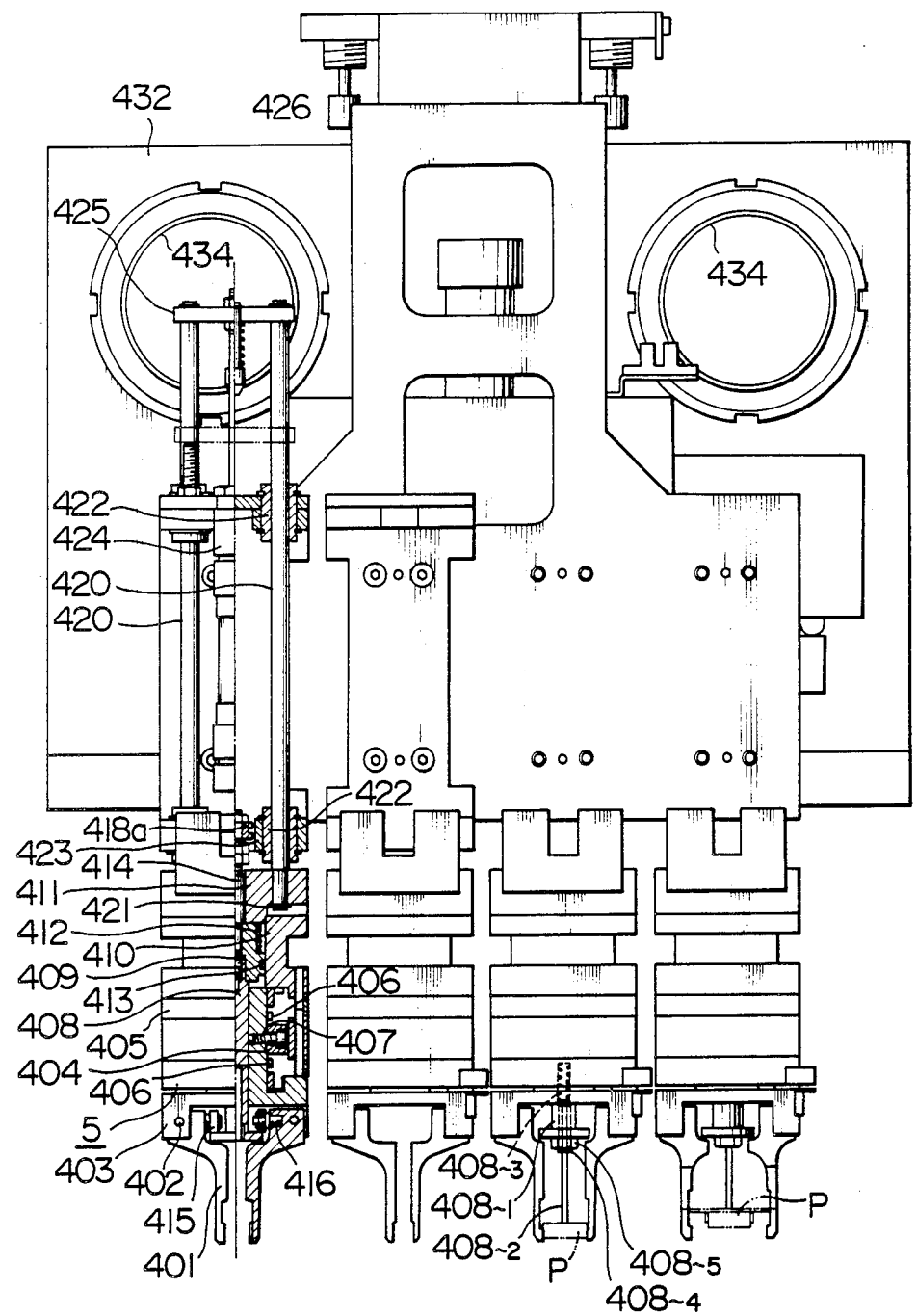
FIGS. 17 and 18 are respectively a partial cutaway elevational view and a side elevational view of an insertion unit.
Figure 18:
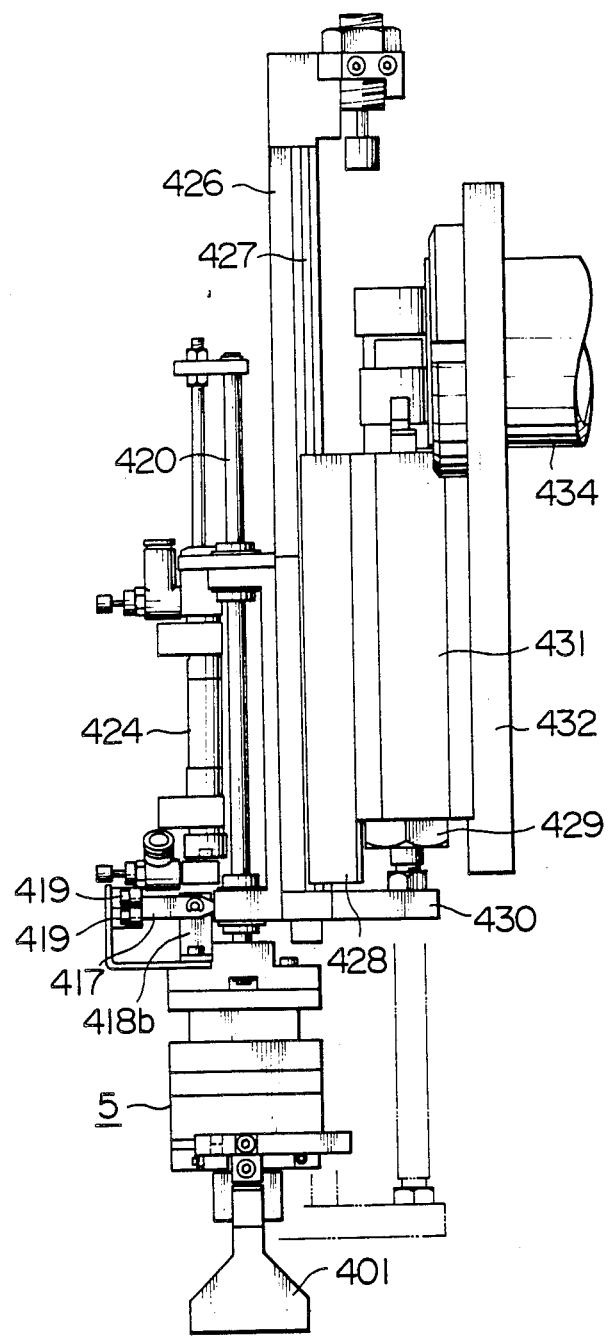
Figure 19:
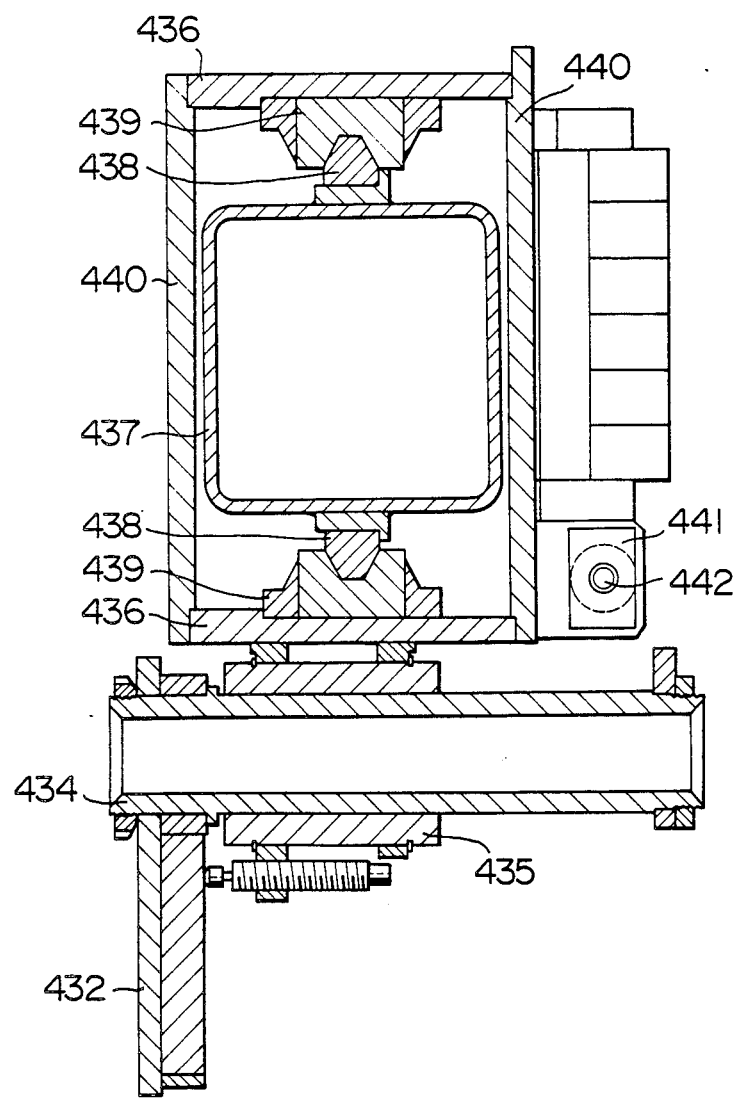
FIG. 19 is a cutaway side elevational view of a hand transferring means.

FIGS. 17 to 21 show the insertion unit INS, wherein FIG. 17 is an elevational view of the insertion unit INS, FIG. 18 a side elevational view thereof; FIG. 19 a cutaway side elevational view of the hand transferring means of the insertion unit INS; FIG. 20 a cutaway side elevational view illustrating the hand transferring means; and FIG. 21 a partially cutaway plan view of the hand transferring means illustrating the transfer in the direction X. The hand will first be explained. The hand 5 has fingers 401 which grasp an electronic part P by closing and opening action; pins 402 which are supporting points for the opening and closing action; finger bodies 403 for holding the fingers 401; a swivel air actuator for swivelling the finger bodies 403 which consists of a vane 404, a vane housing 405, a packing 406, and a bolt 407 for securing the vane 404 to the finger body 403; a single-acting air cylinder which consists of a piston rod 408, a piston 409, a cylinder tube 410, a cylinder cover 411, a compression spring 412, a packing 413, and a bolt 414 for connecting the piston rod 408 and the piston 409; ball bearings 415 which engage portions of the piston rod and which transmit the action of the piston rod 408 to the fingers 401 so as to open or close the fingers 401; pins 416 for attaching the ball bearings to the fingers 401; a detection lever 417 which operates in combination with the opening and closing action of the fingers 401 and detects the opening or closing action of the fingers 401; transmission ring 418a for transmitting the action of the piston rod 408 to the detection lever 417; a holding fitting 418b for retaining the detection lever 417; and the sensors 419 which are provided on the detection lever 417 on the side opposite to the piston rod 408.

The hand elevating means is mainly composed of a guide bar 420 for elevating or lowering the hand 5 so as to insert the electronic part P held by the fingers 401 into the printed board 12; a cover ring 421 for retaining the guide bar 420 to the cylinder cover 411; a linear motion ball bearing 422 for guiding the guide bar 420; a holder 423 for holding the linear motion ball bearing 422; an insertion air cylinder 424 for elevating or lowering the hand 5 by elevating or lowering the guide bar 420; and a connecting plate for connecting the air cylinder 424 and the guide bar 420. The hand transferring means are composed of a hand holding plate 426 which holds a plurality of hands 5 and hand elevating means; a cross roller guide 427 which is designed to elevate or lower all the hands 5 simultaneously by elevating or lowering the hand holding plate 426; a bearing box 428 for holding the cross roller guide 427; an elevating air cylinder 429 for elevating or lowering the hand holding plate 426; a connecting plate 430 for connecting the elevating air cylinder 429 and the hand holding plate 426, a hand holding plate 431 for holding the elevating air cylinder 429 and the bearing box 428; an air cylinder 433 attached to a hand transferring plate 432 which horizontally moves an electronic part from the supply positioning end 3 to the position where it is inserted to a printed board; a guide bar 434, a linear motion bearing 435; holding plates 436 which hold the linear motion bearing 435 and the air cylinder 433; Y axial moving frame 437 for moving the hand 5 in the direction Y so as to take a desired part out of the predetermined supply positioning end; a guide rail 438 which is attached to the upper and lower surfaces of the Y axial moving frame 437; a guide rail bearing 439 which moves along the guide rail 438 and holds the holding plates 436; side plates 440 which connect the upper and lower holding plates 436; a ball screw nut 441 retained by the side plates 440; a ball screw 442 which engages the ball screw nut 441; a ball screw bearing 443 which retains the ball screw 442; a motor 444 for driving the ball screw 442; and a coupling 445 which connects the ball screw 442 and the motor 444. At the original position of each hand 5, the finger 401 is open, the insertion cylinder 424 is elevated, the elevating air cylinder 429 is at the upper limit, the air cylinder 433 is at the withdrawal end, and the finger 401 is stopped right over the supply positioning end 3. When positioning has been completed at each supply positioning end 3, all the insertion cylinders 424 are lowered ready for grasping of the electronic parts P by the fingers 401. When air is introduced into the lower portion of the piston 409 in the cylinder tube 410, the piston 409 is elevated and in conjunction with it the piston rod 408 is also elevated. This action lifts the ball bearings 415 which are retained in the fingers 401 and the fingers 401 are rotated around the pins 402 to grasp thee electronic part P. In conjunction with these actions, the transmission ring 418a is elevated, and the detection lever 417 which is engaged with the transmission ring 418a rotates around the holding fitting 418b. This detection lever 417 interrupts the sensor 419 and detects that the fingers are closed. When the fingers 401 are closed, the insertion cylinder 424 is elevated up to the upper limit. These actions are carried out simultaneously by the plurality of hands. Then the air cylinder 433 advances to feed the electron part P to the printed board 12. If it is required that the part grasped at the supply positioning end be inserted into the printed board 12 in a state wherein the part P has been rotated by 90 degrees from the position at which it was grasped, air is blown into the vane housing 405 to rotate the vane 404 and to swivel the fingers 401 which are indirectly connected to the vane 404, thereby rotating the part P. Thereafter, the elevating air cylinder 429 is lowered. In order to lower the hand 5 alone holding the part P which is to be inserted into the printed board 12, the corresponding insertion air cylinder 424 is lowered, whereby the part P is inserted into the printed board 12. After the insertion, by ceasing to blow air into the cylinder tube 410, the compression spring 412 presses and lowers the piston 409. Thereby the fingers 401 are opened and the detection lever 417 is restored to its original position and interrupts the sensor 419. Thereafter the insertion cylinder 424 is elevated. The insertion of the first electronic part P is completed in this way, and a second and later parts P are subsequently inserted. The second and later insertions are conducted only by elevation and lowering of the insertion cylinder 424 and the opening action of the fingers 401. When the last electron part P is inserted and the insertion cylinder 424 is elevated, the elevating cylinder 429 is elevated. Thereafter the air cylinder 433 withdraws and returns to its original position. In the case of having swivelled the fingers 401 by 90 degrees before insertion, air is blown into the vane housing 405 from the side opposite to the insertion time and restores the fingers 401 so that they are restored to the original position during the period between the point the insertion cylinder 424 reaches the upper limit and the point the air cylinder 433 returns to the withdrawal end.

When it is required that after the electronic part P is inserted into the printed board 12 the leads PF of the part P are further pushed into the printed board 12, the hand 5 is further composed of a piston rod 408-1, a pusher 408-2, a compression spring 408-3, a pusher retainer 408-4 and a locking nut 408-5. When this hand 5 grasps the electronic part P at the supply positioning end 3 and when the insertion cylinder 424 is lowered, the pusher 408-2 comes into contact with the part P and withdraws. In this state the electronic part P is grasped for insertion into the printed board 12. After the insertion, when the fingers 401 are opened and the insertion cylinder 424 is elevated, the pushers 408-2 presses the electronic part P downward by the force of the compression spring 408-3 so as to insert the leads PF deeper into the printed board 12.

When the hand 5 is transferred to a desired supply positioning end 3, it is transferred by the rotation of a ball screw 442 driven by a motor 444. The hand 5 may also be transferred by means of a chain or a wire in place of the ball screw, or by means of a rack and a cyllinder, or an air cylinder.

Figure 22:
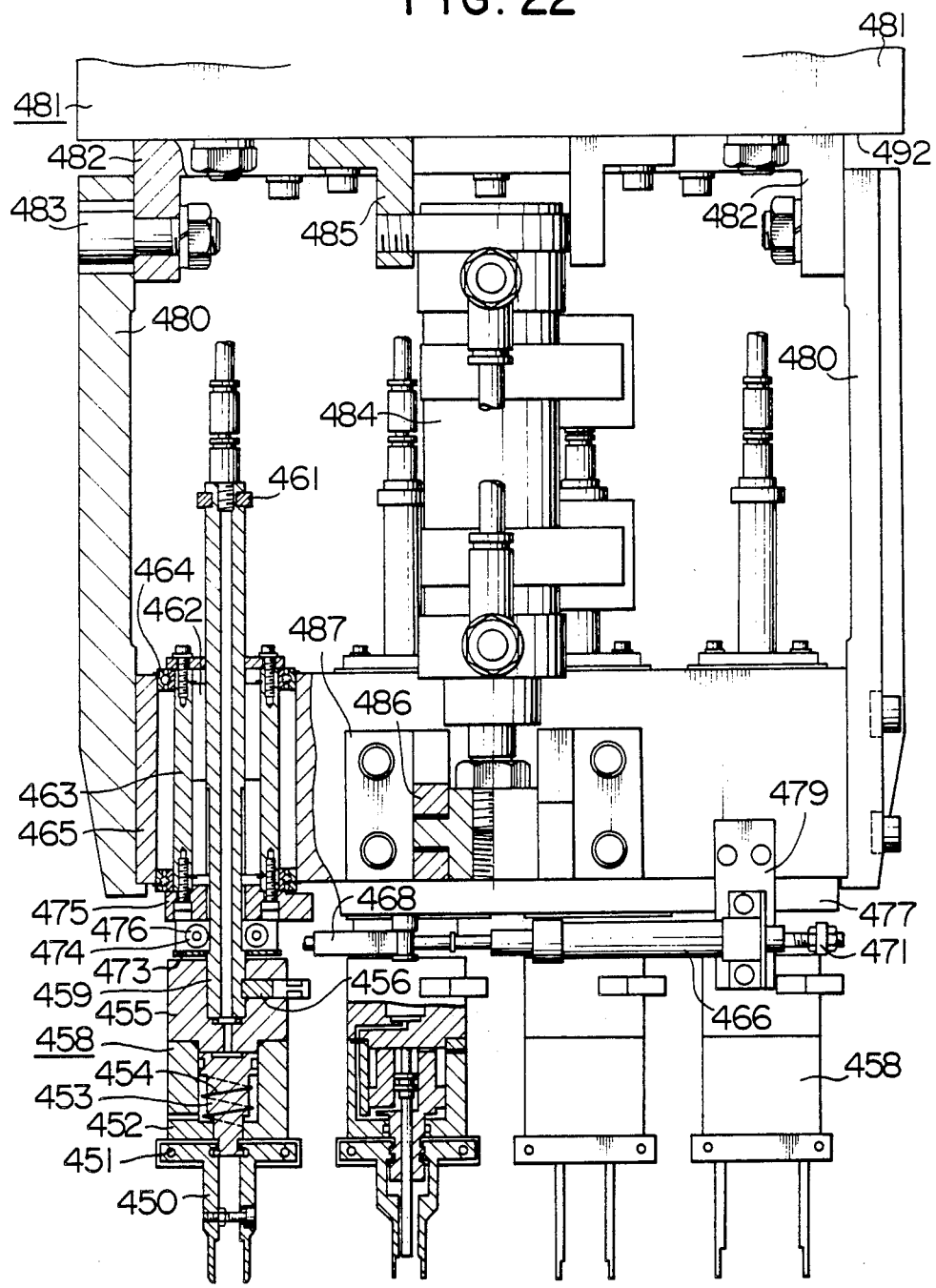
FIGS. 22 and 23 are partial cutaway elevational view of another example of the insertion unit.
Figure 23:
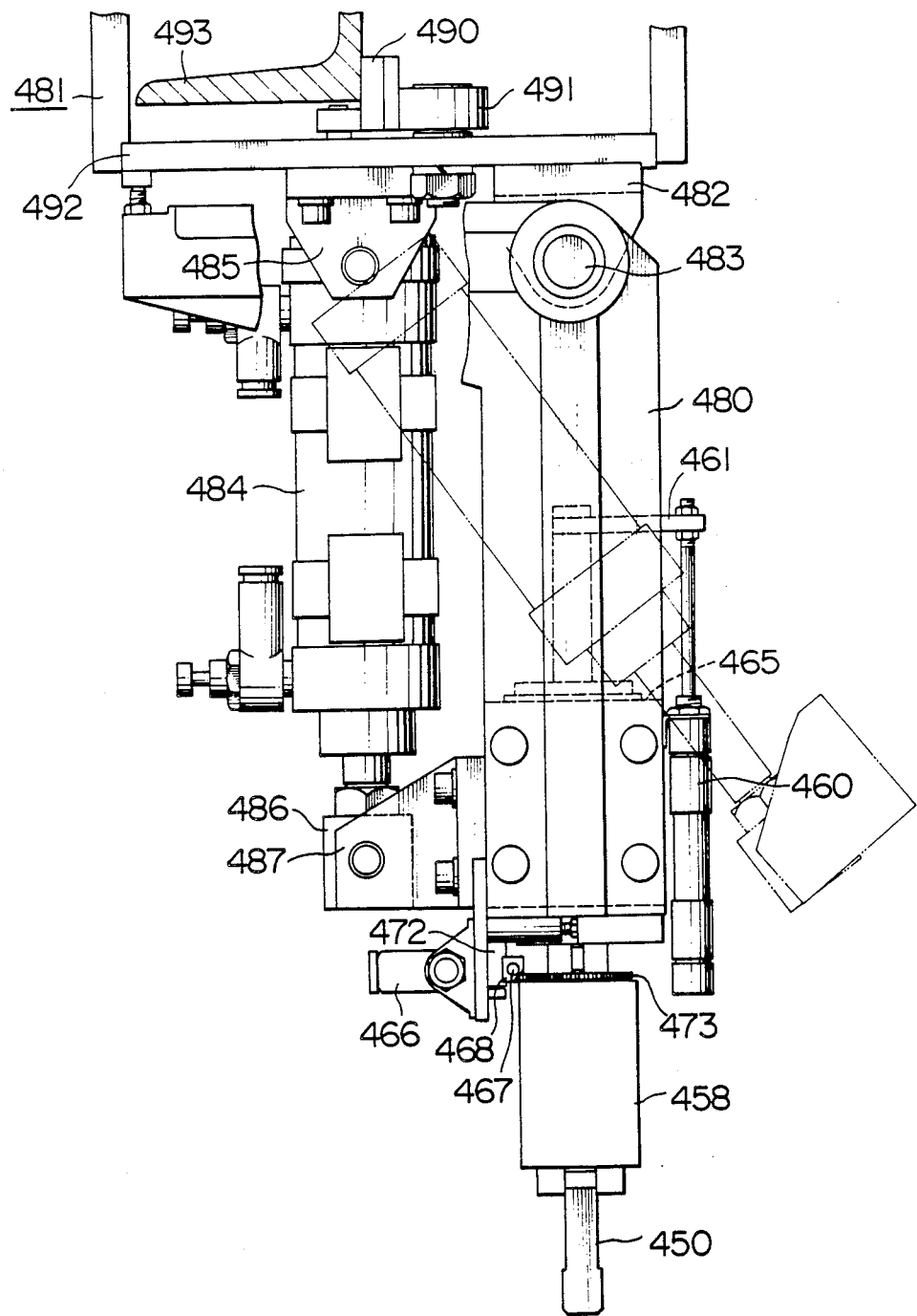
Figure 24:
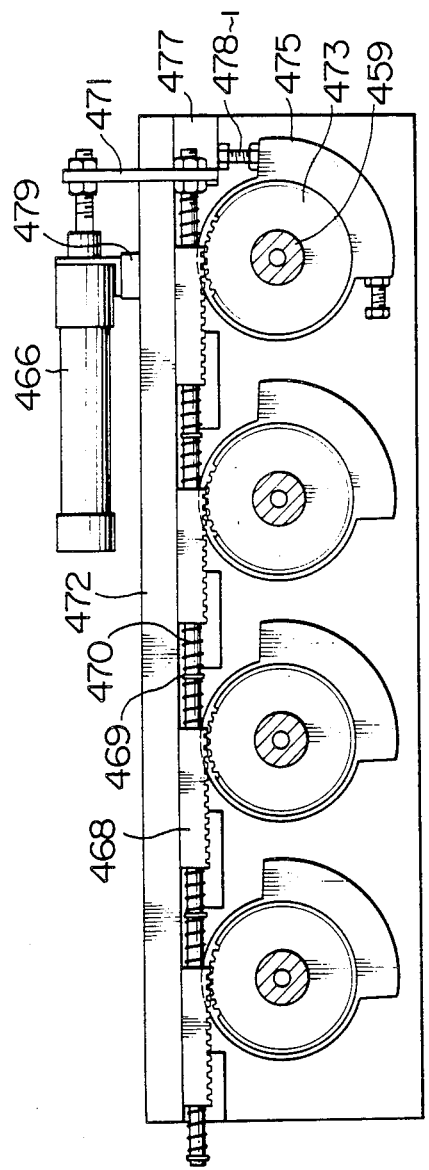
FIG. 24 is a cutaway bottom view of the rotating mechanism of a chuck means.
Figure 25:
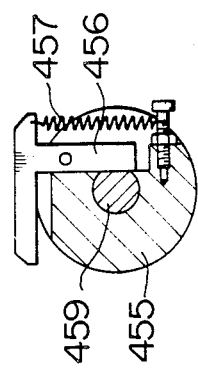
FIG. 25 is a cutaway plan view of a chuck removing mechanism.
Figure 26:
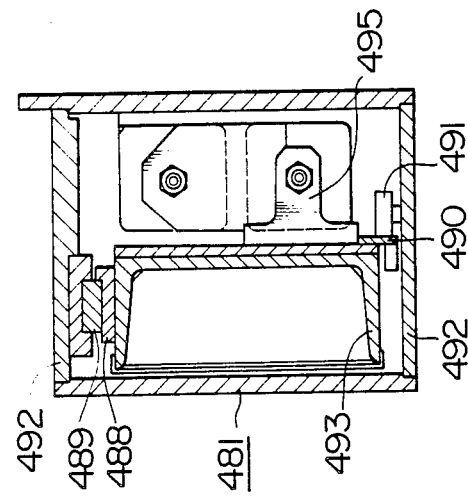
FIGS. 26 and 27 are respectively a cutaway side elevational view and a rear view of a hand transferring means.
Figure 27:
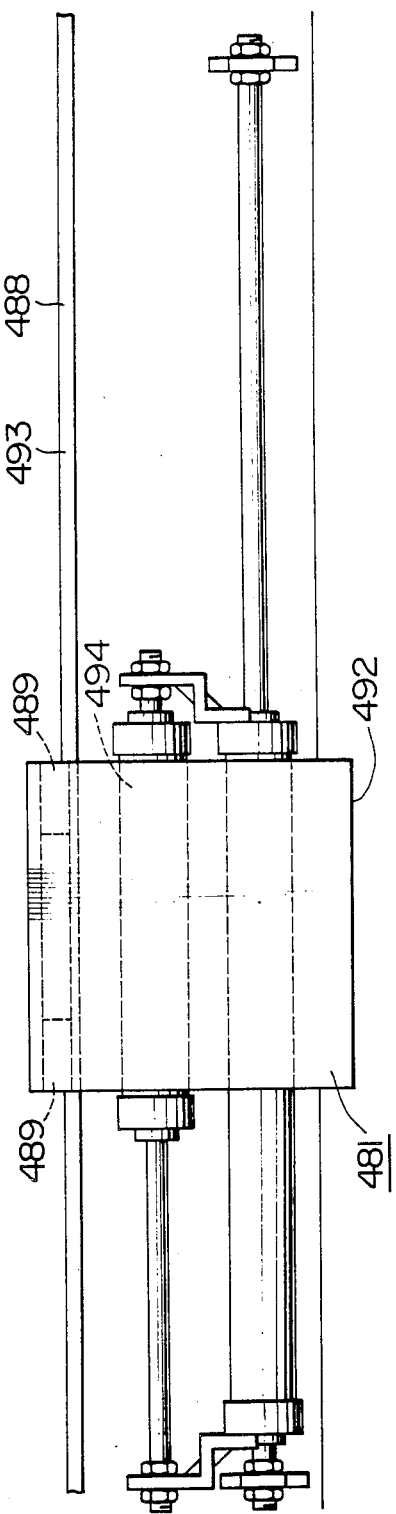

FIGS. 22 to 27 show an improved insertion unit the improvements of which are chiefly applied to the hands 5. FIG. 22 is a partially cutaway elevational view of the insertion unit, FIG. 23 is a side elevational view thereof, FIG. 24 a cutaway bottom view of the rotating means of a chuck, FIG. 25 a cutaway plan view of a means for removing the chuck, and FIGS. 26 and 27 are respectively a cutaway side view and a rear view of a hand transferring means. Hereinunder this unit will be explained with reference to the Figures. In short, the insertion unit has new features in that the process of inserting the electronic part P on the supply positioning end 3 into the printed board 12 is shortened, that a single swivel actuator swivels the plurality of hands 5 simultaneously, and that the hands 5 are easily replaceable.

This insertion unit INS includes chucks 458, the hands 5 which have the main bodies for rotatably supporting the chucks 458, and a transferring means which transfers the hands 5 in the X axial direction. The chuck 458 will be explained first. The chuck 458 is composed of fingers 450 for grasping the electron part P by an opening and closing action; pins 451 which are supporting points for the opening and closing action of the fingers 450; a finger body 452 for holding the fingers 450; a piston 453 for opening or closing the fingers 450; a compression spring 454 for returning the piston 453; a finger joint 455 which serves as a joint when the fingers 450 are replaced; a stopper 456 for fixing the chuck 458 when it is replaced and a tension spring 457 for compressing the stopper 456.

The main body of the hand 5 includes a joint shaft 459 for holding the chuck 458; an elevating cylinder 460 for elevating or lowering the joint shaft 459; a connecting plate 461 which connects the joint shaft 459 and the elevating cylinder 469; a linear motion bearing 462 for guiding the joint shaft 459; a bearing holder 463 which retains the linear motion bearing 462; a radial bearing 464 which retains the outer periphery of the bearing holder 463; a hand holder 464 which holds the radial bearing 464; a swivel air cylinder 466 for swivelling the chuck 458; a swivel pusher 467 which is actuated by the swivel air cylinder 466; a rack 468 which engages with the swivel pusher 467 and which is divided at every chuck 458; rings 469 provided between the divided portions of the rack 468 and at both ends thereof; compression springs 470 retained between the divided portions of the rack 468 and the rings 469; a connecting plate 471 which connects the swivel pusher 467 and the swivel air cylinder 466; a rack guide 472 for guiding the rack 468; a pinion 473 which engages with the rack 468; a roller 474 which engages with the width across flats of the joint shaft 459; a roller holder 475 which is attached to the lower portion of the bearing holder 463 for the purpose of holding the pinion 473; a swivel stopper 477 which is attached to the lower portion of the hand holder 465 for the purpose of determining the rotation angle of the roller holder 475; an adjusting bolt 478 for adjusting the gap between the swivel stopper 477 and the surface of the roller holder 475 which serves as a stopper when the roller holder 475 swivels; a roller pin 476 which connects the roller 474 to the roller holder 475; an attaching plate 479 for attaching the swivel air cylinder 466 to the hand holder 465; swivel arms 480 which retain the hand holder 465 at the center of rotation; rotary arm retainer 482 and rotary arm retaining shafts 483 which attach the hand holder 465 to a hand transferring means 481; a swing cylinder 484 for swivelling the hand holder 465; a swing cylinder retainer 485 which attaches the swing cylinder 484 to the hand transferring means 481; a swing connecting rod 486 which connects the swing cylinder 484 and the holder 465.

The transferring means includes an upper guide rail 488 which retains and guides the hand transferring means 481; an upper guide rail bearing 489; a lower guide rail 490; a cam follower 491; a hand transferring means plate 492 which holds the upper guide rail bearing 489 and the cam follower 491; a hand transferring means frame 493 which holds the upper guide rail 488 and the lower guide rail 490; a transferring cylinder 494 for transferring the hand transferring means frame 493 and the hand transferring means plate 492; and a connecting plate 495 which connects the hand transferring means plate 492 and the transferring cylinder 494.

In the original position of each member of the hand 5, the fingers 450 are open and the swing position is above the printed board 12, the elevating cylinder 460 is at the upper limit and the swing cylinder 484 is at the withdrawal end.

When the positioning of all parts is finished, the swing cylinder 484 advances to swivel the hand 5 to a position right over the supply positioning end 3. The elevating cylinder 460 is next lowered. In order to actuate the piston 453, air is drawn into the finger body 452 through the joint shaft 459, and the fingers 450 are closed to grasp the electronic part P. When the elevating cylinder 460 is elevated after grasping the part P and the swing cylinder 484 is withdrawn, the hand 5 is swivelled to a position above the printed board 12. By actuating the swivel air cylinder 466 during the swivel of the hand 5, the swivel pusher 467 is actuated and the ring 469 push the compression spring 470 and the rack 468. This action of the rack 468 enables the pinion 473 to rotate, and the roller 474 which is integral with pinion 473 to rotate the joint shaft 459 and the fingers 450, whereby the electronic part P can be rotated.

When the fingers 450 holding the electronic part P arrive at a position above the printed board 12, the elevating cylinder 460 is lowered for insertion of the electronic part P into the printed board 12. When air which has been drawn into the finger body 452 is stopped after the insertion of the electronic part P, the piston 453 is restored to its original position by means of the compression spring 454, and the fingers 450 are opened. Thereafter the elevating cylinder 460 is lifted to insert a second electronic part P. In the case of removing the chuck 458 from the joint shaft 459, the stopper 456 is pushed toward the outer periphery of the chuck 458 in order to be removed from the groove of the joint shaft 459 and the chuck is lowered for removal.

Figure 31:
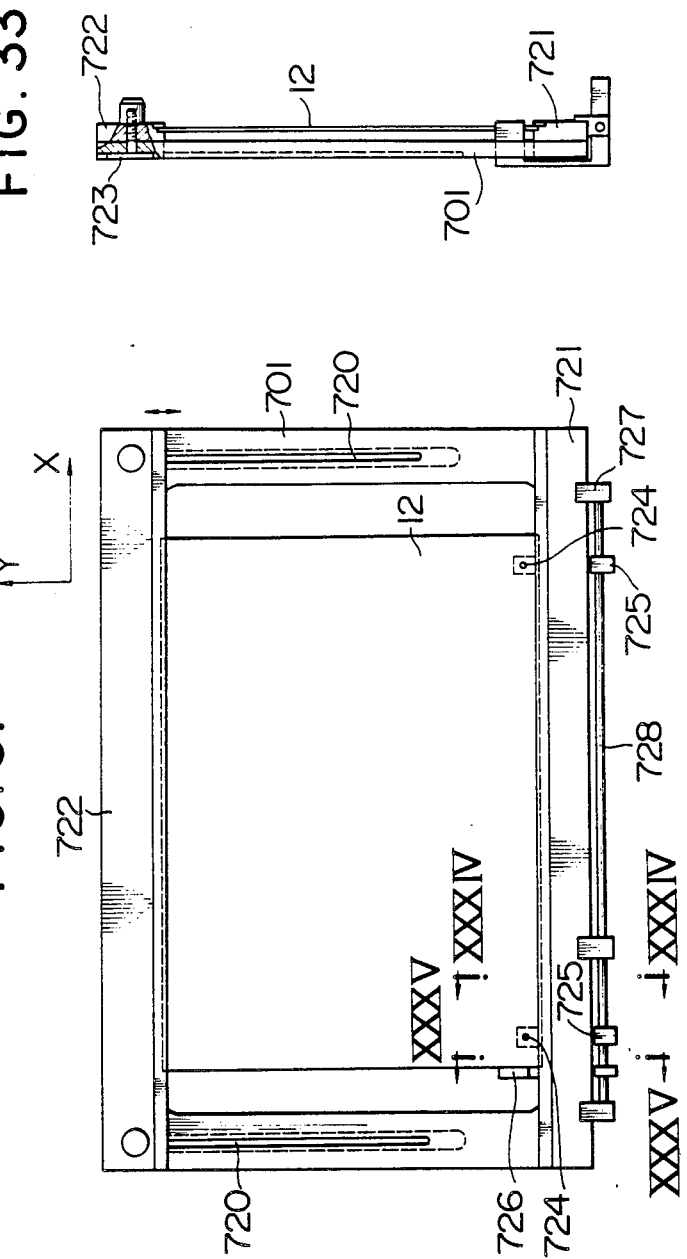

The X-Y table will now be explained. FIGS. 28, 29 and 30 show the structure of the X-Y table T which carries the printed board 12 and positions it by moving it on the horizontal plane. FIG. 29 is a plan view of the X-Y table T, and FIGS. 30 and 31 are respectively an elevational view and a side view thereof. The X-Y table T is composed of an upper table 701 and a lower table 702. The two tables 701 and 702 are slidable in the direction Y and the direction X, which is orthogonal to Y, respectively. The lower table 702 is mounted through bearings 705 on a pair of rails 704 which are laid on a bed plate 703 in the direction X. Similarly the upper table 701 is mounted through bearings 710 on a pair of rails 709 which are laid on the lower table 702 in the direction Y. The lower table 702 is driven by rotating a motor 717 which is mounted on the bed plate 703 and thereby rotating a male screw 707 through a coupling 706 and sliding a female screw 708 which is secured to the lower table 702. The upper table 701 is driven by rotating a motor 711 which is mounted on the lower table 702 and thereby rotating a male screw 713 through a coupling 712 and sliding a female screw 714 which is secured to the upper table 701. Each of the driving motors 711 and 717 is provided with encoders 715 and 716, respectively, which detect an appropriate position in the positioning of the X-Y table T.

It is possible to apply to the driving and positioning of the X-Y table not only a combination of control motors and ball screws but also a combination of control motors and wires, linear motors, or means having a similar function.

Figure 33:
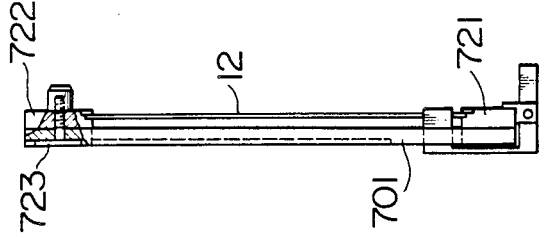
FIGS. 31, 32 and 33 are respectively a plan view, elevational view and a side elevational view of a printed board holding device.
Figure 32:
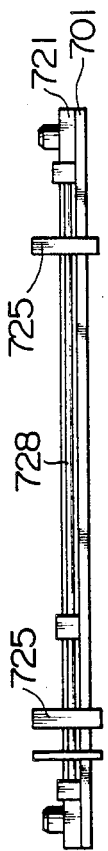
Figure 34:
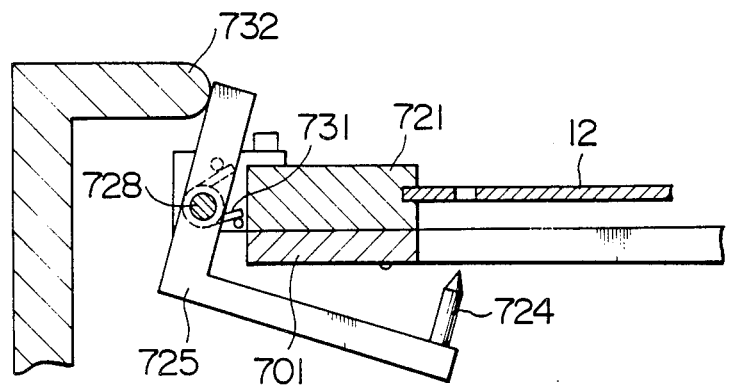
FIG. 34 is a sectional view of the device taken along the line 34—34 of FIG. 31.
Figure 35:
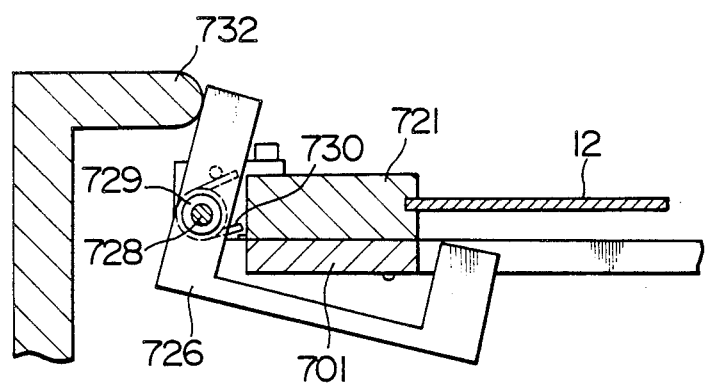
FIG. 35 is a sectional view of the device taken along the line 35—35 of FIG. 31.

FIGS. 31, 32, 33 show an example of a frame device for holding the printed board which is mounted on the upper table 701, wherein FIG. 31 is a plan view of the device, and FIGS. 32 and 33 are respectively an elevational view and a side elevational view thereof. FIGS. 34 and 35 are detailed views of a pin lever and a printed board stopper, respectively.

The printed board holding device will be explained in the following with reference to the Figures. This printed board holding device is provided with a pair of guide rails 721 and 722 which have guide grooves for holding the printed board 12 and which are parallel to each other in the direction X. One guide rail 721 is fixed and the opposite guide rail 722 is slidable in the direction Y in accordance with the width of the printed board 12 to be carried. This rail 723 can be fixed by tightening T bolts 723 in slits 720 which are formed on the upper table 701. Levers 725 having pins 724 for positioning the printed board 12 and a blocking stopper 726 are provided on the side of the fixed rail 721. The levers 725 are attached to a rotatable shaft 728 which is parallel to the fixed rail 721 and are movable in the direction of the shaft in accordance with the length of the printed board 12. The lever 725 is clamped by a spring 731 in the normal state and is unclamped by pressing the end of the lever.

FIG. 35 is a detailed side elevational view of the printed board stopper 726. The printed board stopper 726, which is connected to the shaft 728 through a bearing 729, is located at the blocking position by a spring 730 in the normal state and is released by pushing the lever of the blocking stopper 726. A dog 732 is provided at a position at the stroke end of the X-Y table T where the pin lever 724 and the printed board stopper 726 come into contact with the dog 732. By pushing the pin lever 725 or the printed board stopper 726 by the dog 732, the positioning pins 724 and the printed board stopper 726 are released. In this way, without providing an actuator on the sliding X-Y table T, the levers are actuated by making use of the positioning device of the X-Y table.

Figure 36:
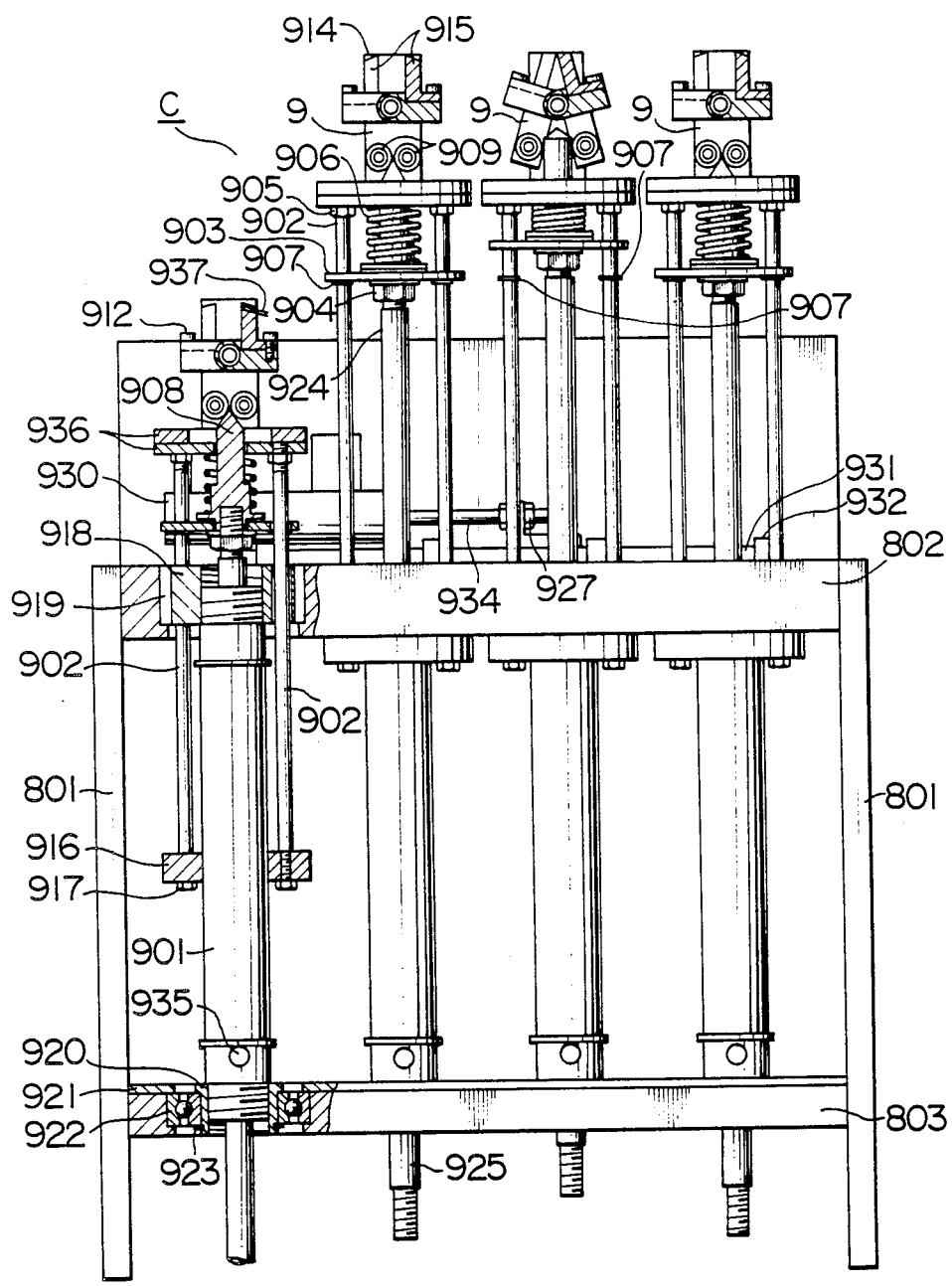
FIGS. 36 and 37 are respectively a cutaway elevational view and a side view of a clinching means.
Figure 37:
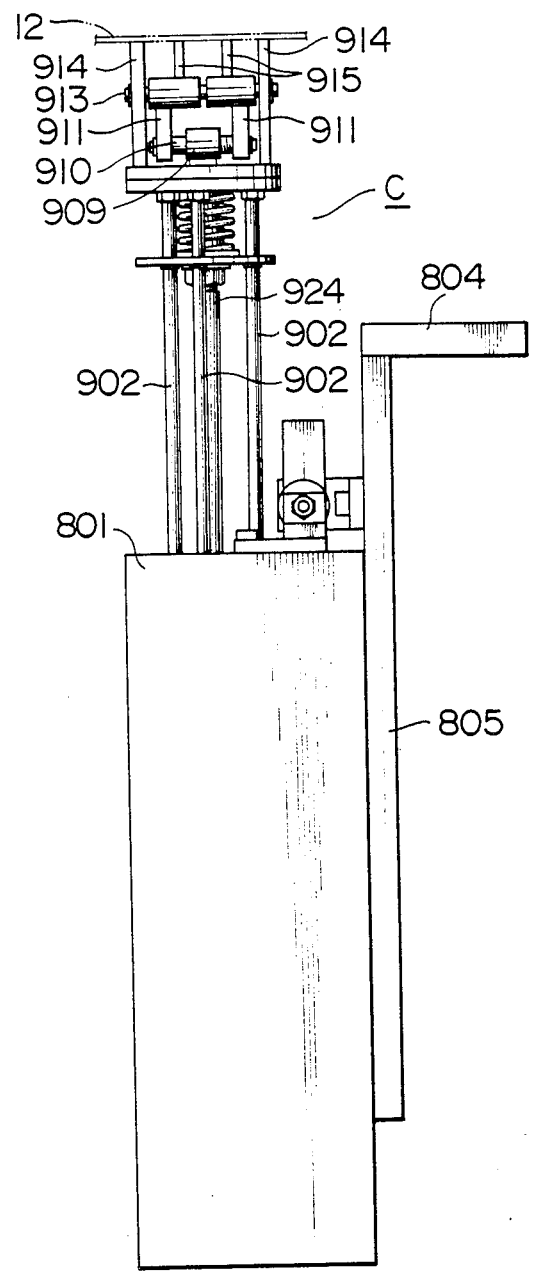

The clinching means C will next be explained. The clinching means has four clinching units 9. Since the power source for the four clinching units 9 is air pressure, pressurized air is put into the clinching means C by way of a pipe from the power source. The pressurized air is divided by an air regulator into two, namely, air the pressure of which is low (hereinunder referred to as low pressure air) and the air the pressure of which is that existing before being lowered (hereinunder referred to as normal pressure air), and each of them is controlled by the control means CON so as to actuate the four clinching units. FIGS. 36, 37 and 38 show the clinching means C, wherein FIG. 36 is a partially cutaway view of the clinching means C, FIG. 37 a side elevational view thereof and FIG. 38 a plan view of the rotating mechanism of the clinching means C. In the Figures, a referential number 901 represents a single-acting double rod cylinder, 902 an auxiliary rod, 903 a pre-load adjusting nut, 905 a parallel adjusting nut, 906 a pre-load spring, 907 a cover ring, 908 a clinch actuator rod, 909 a roller, 910 a roller retaining shaft; 911 a clincher block for transmitting a clinching action; 912 a clincher set-screw; 913 a clincher shaft, 914 printed board supporter; 915 a clincher; 916 a clinching unit elevation stopper, 917 a clinching unit elevation adjusting nut, 918 a clinching unit swivel plate; 919 a bearing, 920 a clinching unit swivel plate; 921 a bearing slip stopping plate, 922 a bearing, 923 a snap ring, 924 an upper cylinder rod, 925 a lower cylinder rod, 926 a rotation stopper, 927 a rotation angle adjusting nut, 928 a transmission plate, 929 a cylinder fixing plate, 930 a double-acting cylinder, 931 a rotation transmitting plate, 932 a bearing, 933 a rotation transmitting shaft, 934 a cylinder rod, 935 an air inlet, 936 a clinching unit head base, 937 a sensor, 801 a side plate, 802 an upper clinching unit supporting plate, 803 a lower clinching unit supporting plate, 804 an adapter plate, and 805 a back plate.

A mechanism for elevating and lowering the clincher unit 9 will first be explained. The clinching unit swivel plate 918 is screwed to the upper portion of the sigle-acting double rod cylinder 901 and the clinching unit swivel plate 920 is screwed to the lower portion of the cylinder 901. The clinching unit swivel plate 920 on the lower portion is inserted into the bearing 922 and is prevented from slipping off by the snap ring 923. The bearing 922 is inserted into the bearing receiving hole on the lower clinching unit supporting plate 803, and is attached to the lower clinching unit supporting plate 803 by the bearing slip stopping plate 921. Three auxiliary rods 902 are provided such as to penetrate through the upper clinching unit supporting plate 918. On the upper portion of the three auxiliary rods 902 the pre-load supporting plate 918 is provided such that the three rods penetrate the supporting plate 918. At an appropriate position above each auxiliary rod 902 a cover ring 907 is disposed, and the pre-load supporting plate 903 is disposed above each ring 907. The uppermost end of each auxiliary rod 902 is threaded and after the parallel adjusting nut 905 is threaded to each rod 902, each rod 902 is screwed into each corresponding hole formed on the clinching unit head base 936. The clinching unit head base 936 and the pre-load supporting plate 903 are adjusted to be parallel and horizontal and the pre-load of the pre-load spring 906 is also adjusted by the parallel adjusting nut 905. The lower portion of each of the three auxiliary rods 902 is inserted into each corresponding hole formed on the clinching unit elevation stopper 916, and at the lowermost threaded end of each auxiliary rod 902 the clinching unit elevation adjusting nut 917 is mounted to adjust the stroke of the elevation of the clinching unit 9. The bearing 919 is provided on the outer periphery of the clinching unit swivel plate 918, and the bearing 919 is inserted into the bearing receiving hole on the upper clinching unit supporting plate 802. The upper and lowerclinching unit supporting plates 802 and 803 holding four clinching units 9 of the above-described structure are supported by the two side plates 801 and the back plate 805 and the entire portion of the clinching means C is secured to the main body by the adapter plate 804.

The elevating and lowering action of the clinching unit 9 is as follows. Low pressure air is first put into the air inlet 935 of the single-action double rod cylinder 901. The low pressure air acts within the cylinder 901 and elevates the upper cylinder rod 924. This elevating force is transmitted from the clinching unit head base 936 to the three auxiliary rods 902 through the pre-load spring 906, thereby elevating the three auxiliary rods 902 and the clinching unit head base 936 together with the upper cylinder rod 924. When the clinching unit elevation stopper 916 which is attached to the three auxiliary rods 902 abuts the upper clinching unit supporting plate 802, the upper cylinder rod 924 is stopped through the three auxiliary rods 902, the clinching unit head base 936 and the pre-load spring 906, and at this position the printed board supporter 914 abuts the lower surface of the printed board. In order to prevent the pre-load spring 906 from being compressed when the elevating force is transmitted at this ascending time, the pre-load compression spring 906 is compressed by the parallel adjusting nut 905 such as to be pre-loaded. This state is illustrated in the first action shown in FIG. 36. At this time, the pressure of the low pressure air is balanced by the inner descending force of the single-acting double rod cylinder 901, the gravity force of that which has been elevated at the ascending time and the force applied on the pre-load spring 906. In this balanced state, the force applied on the pre-load spring supports the printed board supporter 914 so that the printed board is not warped. The ascending stroke at this time is adjusted by the clinching unit elevation adjusting nut 917. When the first action is completed, the electronic part P is inserted into the printed board by the hand 5.

The structure of the clincher portion will be now explained. Each of the two cylindrical rollers 909 is attached to the roller retaining shaft 910 such as to be rotatable in the peripheral direction. The roller retaining shaft 910 is attached to the corresponding clincher blocks 911. The clincher blocks 911 are attached symmetrically by the clincher shaft 913. To each clincher block 911 above the clincher shaft 913 is attached the clinchers 915. The sensor 937 for detecting the presence of the leads of the part in the direction in which the clinchers 915 move is provided within each clinder 915. Both ends of the clincher shaft 913 are held by the printed board supporter 914. The rollers 909 are disposed such as to be symmetrical with each other in the axial direction of the clincher shaft 913, and in the normal state the two rollers 909 are in contact with each other by virtue of the effect of gravity or the spring force provided between the two retaining shafts 910. The cylindrical clinch actuator rod 908 is disposed below the abutting rollers 9.

The clinching action of the clinchers 915 will be next explained. After the first action shown in FIG. 36, namely, when the part P is inserted into the printed board 12, by the command of the control means CON the air pressure source is changed from the low pressure air to the normal pressure air, and the air to be supplied to the air inlet 935 is also changed from the low pressure air to the normal pressure air. This difference in pressure between the normal pressure air and the low pressure air compresses the pre-load spring 906, whereby the pre-load supporting plate 903, the upper cylinder rod 924 and the clinch actuator rod 908 are elevated. When the clinch actuator rod 908 is elevated, it enters between the two abutting rollers 909, which are separated from each other in the opposite arcuate directions around the clincher shaft 913. Thereby the roller retaining shaft 910, clinchers 915, and the clincher blocks 911 all move in the same direction around the opening and closing shaft 913. Therefore the clinchers 915 assume the closed state and clinches the leads of the electronic part P which exists in the rotating direction of the clinch claws 915. This state is illustrated in the second action shown in FIG. 36. When the clinching of the leads is completed, air is cut off at the instruction of the control means CON. Then the pre-load spring 906 pushes the pre-load supporting plate 903 downwardly such as to stretch itself, and the pre-load supporting plate 903 abuts the cover ring 907. The upper cylinder 924 is lowered to assume its normal state, as is shown in FIG. 36.

The rotating mechanism of the clinching means will be explained in detail in the following. FIG. 38 is a cutaway plan view of the rotating mechanism. The clinching unit rotating plate 918 is provided with the rotation transmitting shaft 933 in a circumferentially intermediate position between any two adjacent holes selected from among the three holes into which the three auxiliary rods 902 are inserted. The bearing 932 is provided on the outer periphery of the rotation transmitting shaft 933. In addition are provided the rotation transmitting plate 931 which retains the bearing 932 of each of the four clinching units 9 with the same pitch, the transmitting plate 928 which connects the rotation transmitting plate 931 and the cylinder rod 934, the rotation angle adjusting nut 927 which positions the transmitting plate 928 and the cylinder rod 934, the rotation stopper 926 for blocking the cyoinder rod 934 which is attached to the back plate 805, and the cylinder adapter plate 929 for securing the double-acting cylinder rod 930 to the back plate 805.

The operation will be explained in the following. The linear motion of the double-acting cylinder rod 930 is transmitted to the linear motion of the rotation transmitting plate 931 through the transmitting plate 928, and this linear motion is converted into the rotary motion which rotates the clinching unit rotating plate 918 around the single-acting double rod cylinder 901 through the bearing 932 and the rotation transmitting shaft 933. This rotary motion is transmitted to the three auxiliary rods 902 and the single-acting double rod cylinder 901 through the clinching unit rotating plate 918, thereby rotating the clinching unit 9. Since the rotation transmitting plate 931 connects the four clinches 9, all the four clinching units 9 rotate simultaneously. The rotation angle can be adjusted by changing the distance of the linear motion of the rotation transmitting plate 931. Furthermore, in order to detect the stage of operation of each clinching unit 9 by means of the control means CON, the position of the lower cylinder rod 925 is detected by a sensor.

While there has been described what are at present considered to be the preferred embodiments of the invention, it will be understood that various modifications may be made therein, and it is intended that the appended claims cover all such modifications as fall within the true spirit and scope of the invention.

What is claimed is:

1. An apparatus for automatically inserting electronic parts comprising:
a plurality of electronic parts supplying means, each fixedly disposed at a respective predetermined position to store a multiplicity of electronic parts and to supply said electronic parts successively;
a corresponding plurality of feeding means respectively associated with said supplying means for feeding said electronic parts, after they have been respectively supplied successively from said electronic part supplying means, to a corresponding plurality of fixed predetermined supply positioning ends;
an insertion unit including a corresponding plurality of hand means, each for respectively grasping an electronic part at a respective one of said supply positioning ends to transfer the grasped electronic part to a respective predetermined specific fixed insertion position and inserting the leads of the grasped electronic part into a respective receiving hole of a printed board;

an X-Y table means for holding the printed board into which said electronic part is inserted and moving said printed board to locate said printed board at a desired position on the X-Y plane in accordance with an insertion position instruction;

means for providing an insertion position instruction different for each of said electronic parts;

a clinching means on the opposite side of said table from said insertion unit, to approach the printed board from a fixed original position to support the printed board and then clinch the leads of the electronic part inserted into the printed board; and control means for controlling a predetermined operation of each of said means, said control means controlling each of said hands to operate separately from each other during the period of inserting the electronic part, and operate simultaneously during other periods including the grasping and transferring.

2. An apparatus for automatically inserting an electronic part according to claim 1, wherein said insertion unit is mounted for reciprocating only in one predetermined direction between said positioning ends and said insertion position.

3. An apparatus for automatically inserting an electronic part according to claim 2, wherein said plurality of supply positioning ends are arranged in spaced relation in said predetermined direction.

4. An apparatus for automatically inserting an electronic part according to claim 2, wherein said insertion unit has transferring means for transferring each said hand in the direction orthogonal to said predetermined direction.

5. An apparatus for automatically inserting an electronic part according to claim 1, including means mounting said insertion unit rotatably for rotating during grasping the electronic part and inserting the electronic part into the printed board.

6. An apparatus for automatically inserting an electronic part according to claim 5, wherein said insertion unit is mounted for reciprocating only in one predetermined direction between said positioning ends and said insertion position.

7. An apparatus for automatically inserting an electronic part according to claim 6, wherein said plurality of supply positioning ends are arranged in spaced relation in said predetermined direction.

8. An apparatus for automatically inserting an electronic part comprising:

a plurality of electronic part supplying positioning means for positioning and supplying electronic parts in succession;

a printed board positioning means for holding the printed board and locating the insertion position of the printed board at a fixed specific insertion position where electronic parts are inserted; and an electronic part inserting means for simultaneously clamping a plurality of electronic parts respectively positioned by said electronic part supplying positioning means, transferring the clamped electronic parts together to said specific insertion position, and successively inserting the clamped and transferred electronic parts into respective predetermined positions of the printed board.

9. An apparatus for automatically inserting an electronic part according to claim 8, wherein said electronic part supply positioning means are arranged in a predetermined direction, and said electronic part inserting means is movable in said direction.

* * * * *